United States Patent
Barrenscheen et al.

(10) Patent No.: US 9,742,430 B1
(45) Date of Patent: Aug. 22, 2017

(54) SYSTEM AND METHOD FOR ANALOG TO DIGITAL CONVERSION

(71) Applicant: Infineon Technologies AG, Neubiberg (DE)

(72) Inventors: Jens Barrenscheen, Munich (DE); Matthias Bogus, Munich (DE); Benno Koeppl, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/242,265

(22) Filed: Aug. 19, 2016

(51) Int. Cl.
*H03M 3/00* (2006.01)
*H03M 1/12* (2006.01)

(52) U.S. Cl.
CPC ......... *H03M 3/458* (2013.01); *H03M 1/1245* (2013.01); *H03M 3/344* (2013.01)

(58) Field of Classification Search
CPC .... H03M 3/458; H03M 1/1245; H03M 3/334; H03M 1/007; H03M 1/126
USPC .......................................... 341/143, 155, 144
See application file for complete search history.

(56) References Cited

U.S. PATENT DOCUMENTS

| | | | | |
|---|---|---|---|---|
| 2005/0237233 A1* | 10/2005 | Muhammad | .......... | H03M 3/392 341/143 |
| 2007/0192392 A1* | 8/2007 | Tinker | .............. | H03H 17/0671 708/300 |
| 2010/0057474 A1* | 3/2010 | Kong | ..................... | G10L 21/00 704/500 |
| 2013/0278197 A1* | 10/2013 | Sasaki | .................... | H02P 23/00 318/490 |
| 2013/0321188 A1* | 12/2013 | Hausmann | ............ | H03M 3/352 341/119 |
| 2016/0093017 A1* | 3/2016 | Ayers | .................... | G06T 3/4015 382/299 |
| 2016/0365819 A1* | 12/2016 | Masuda | ................... | H02P 6/08 |

\* cited by examiner

*Primary Examiner* — Peguy Jean Pierre
(74) *Attorney, Agent, or Firm* — Slater Matsil, LLP

(57) ABSTRACT

In some embodiments, a method of operating a sigma-delta analog-to-digital converter (ADC) includes converting an analog input signal into a sequence of digital data using a sigma-delta modulator of the sigma-delta ADC, setting a first configuration for a decimation filter of the sigma-delta ADC according to a first condition of a measurement window, filtering the sequence of digital data using a low-pass filter (LPF) of the decimation filter, and in response to a change in the measurement window, setting a second configuration for the decimation filter according to a second condition of the measurement window.

42 Claims, 12 Drawing Sheets

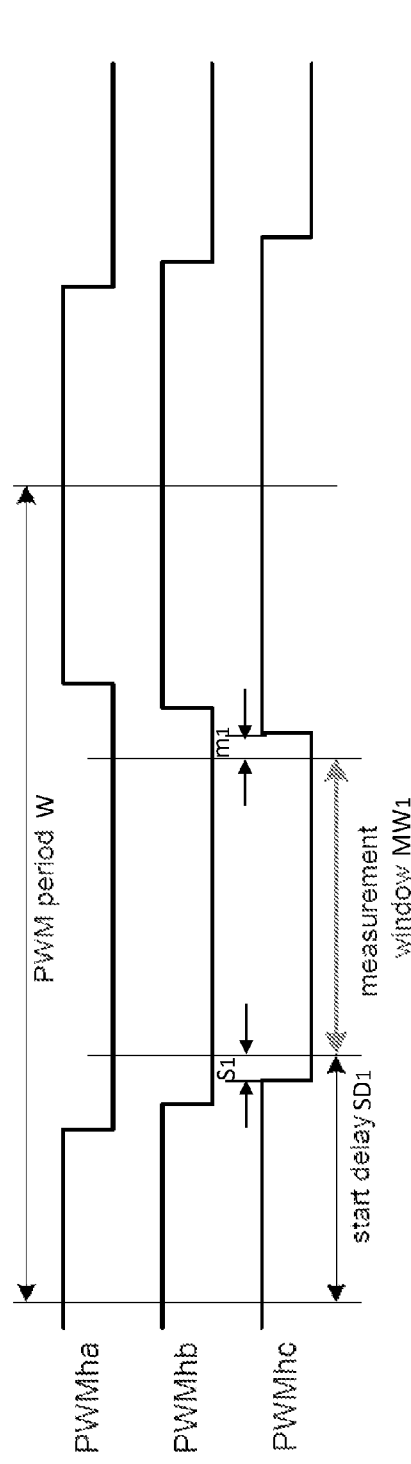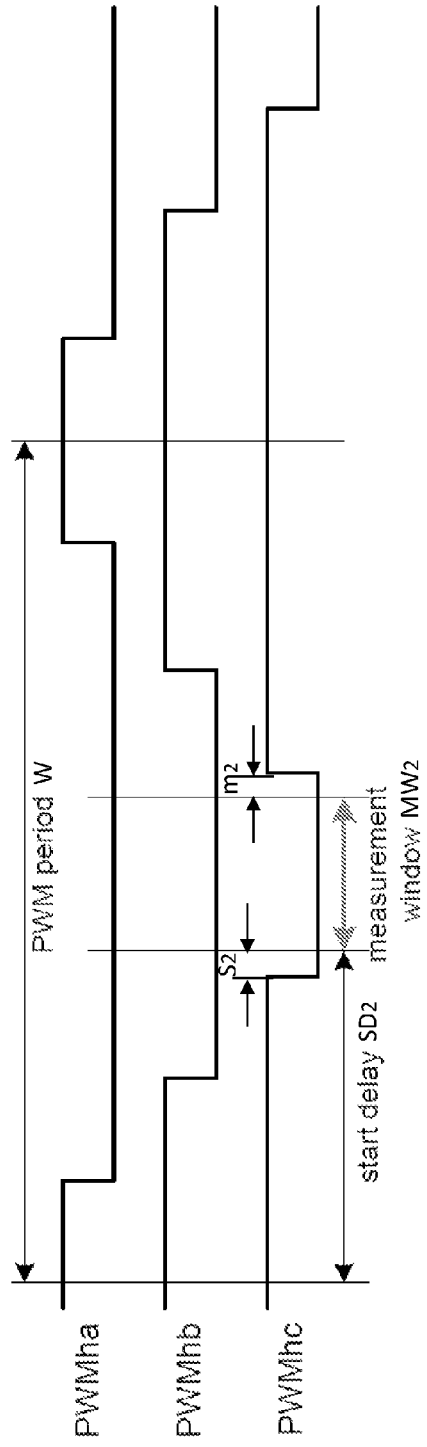

SYSTEM AND METHOD FOR ANALOG TO DIGITAL CONVERSION

TECHNICAL FIELD

An embodiment of the invention relates generally to electrical circuits, and more particularly to system and method of analog to digital conversion.

BACKGROUND

AC motors such as three-phase motors are gaining popularity in applications such as automotive, industrial, and HVAC (heat, ventilating and air conditioning). By replacing the mechanical commutator used in traditional motors with electronic devices, improved reliability, improved durability and small form factors are achieved. Additional advantages of three-phase motors include better speed versus torque characteristics, faster dynamic response, and higher speed ranges, as examples. Generally, an AC motor (e.g., a three-phase motor) has a controller that generates a pulse-width modulated (PWM) signal used to produce drive signals for power switches coupled to different phases of the motor. These PWM signals may determine the average voltage and average current supplied to the coils of the motor, thus controlling the motor speed and torque.

For closed-loop control of the AC motor, the status of the motor may be provided to a controller of the motor system, e.g., via a feedback path. For example, phase currents of the three-phase motor are measured and the measured values are sent to the controller, which generates the PWM control signals based on the measured values of the phase currents. Analog-to-digital converters (ADCs) are often used to convert analog signals (e.g., the phase current in each phase of the three-phase motor) into digital data in motor control applications.

SUMMARY OF THE INVENTION

In accordance with an embodiment, a method of operating a sigma-delta analog-to-digital converter (ADC) includes converting an analog input signal into a sequence of digital data using a sigma-delta modulator of the sigma-delta ADC, setting a first configuration for a decimation filter of the sigma-delta ADC according to a first condition of a measurement window, filtering the sequence of digital data using a low-pass filter (LPF) of the decimation filter, and in response to a change in the measurement window, setting a second configuration for the decimation filter according to a second condition of the measurement window.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be redescribed in the interest of brevity. For a more complete understanding of the invention, reference is now made to the following descriptions taken in conjunction with the accompanying drawings, in which:

FIGS. 3A and 3B illustrate two different measurement windows under two different operating conditions for a three-phase motor system;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely converting the phase currents of a three-phase motor into digital values adaptively in response to a change in the measurement window. Embodiments of the present invention may also be applied to other types of analog-to-digital conversion applications under varying operating conditions.

In motor control applications, sigma-delta ADCs are often used to measure the three phase currents of a three-phase motor. In various embodiments, the filter order (R) and/or the decimation rate (D) of a decimation filter of a sigma-delta ADC is adjusted adaptively in response to a change in the measurement window. In some embodiments, R and D are chosen such that a time interval occupied by R×D samples fed into the decimation filter is less than a duration of the measurement window, and a pre-determined bit precision is achieved for the digital value at the output of the decimation filter. A gain factor of a scaling unit of the sigma-delta ADC is also adaptively adjusted with the adjustment of R and D, such that a total gain of the sigma-delta ADC remains substantially the same before and after the change in the measurement window.

Figure 1:
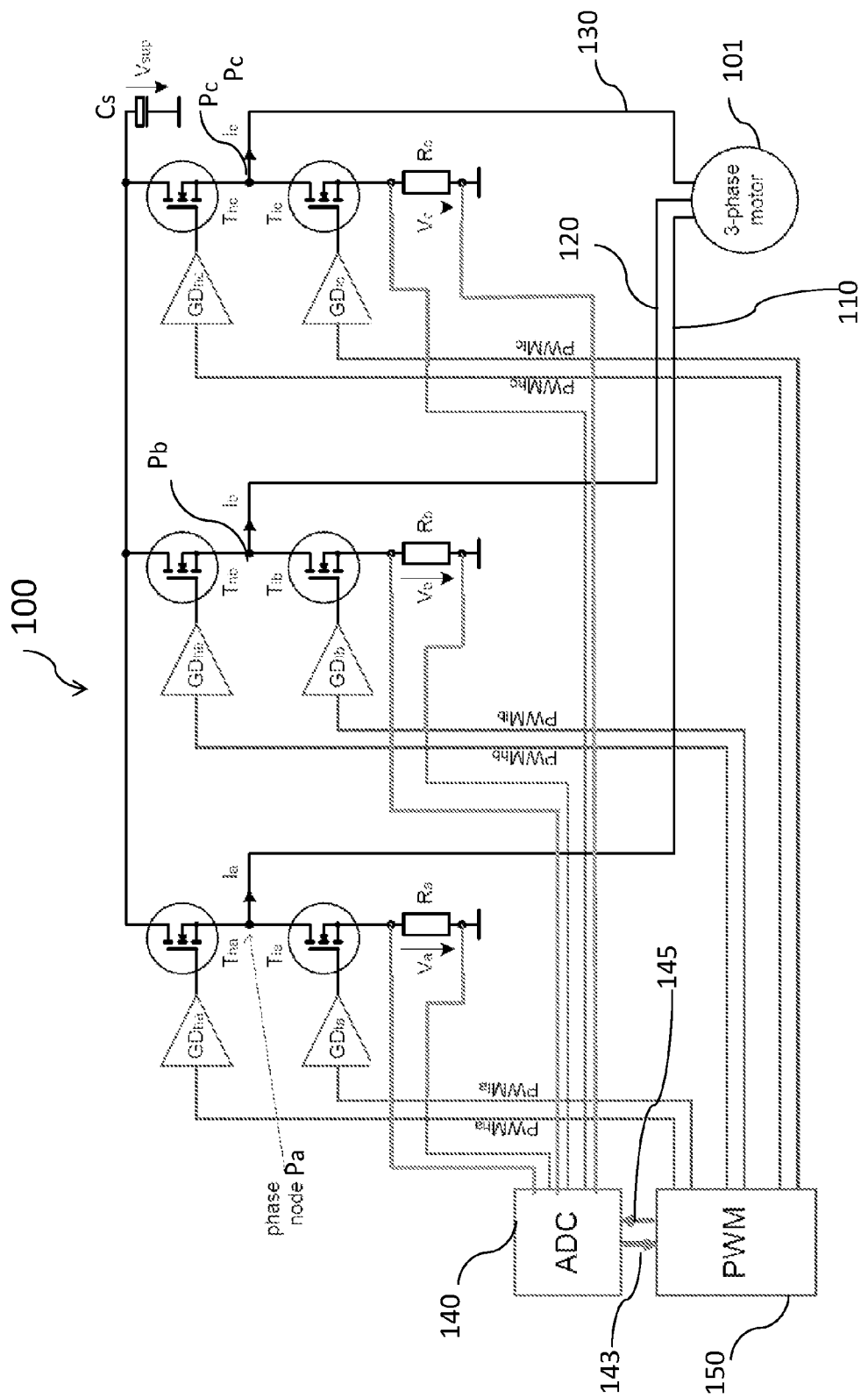
FIG. 1 illustrates a schematic view of a three-phase motor system.

Referring to FIG. 1, motor system 100 includes an AC motor 101 (e.g., a three-phase motor 101) connected to power supply $V_{sup}$ (illustrated as a voltage $V_{sup}$ across capacitor $C_s$) via three half bridges. Each of the three half bridges includes a high-side switch (e.g., $T_{ha}$, $T_{hb}$ or $T_{hc}$) coupled in series with a low-side switch (e.g., $T_{la}$, $T_{lb}$ or $T_{lc}$), with the high-side switch coupled to the higher potential terminal of the power supply $V_{sup}$ and the low-side switches coupled to the lower potential terminal of the power supply. For example, a first half bridge includes high-side switch $T_{ha}$ coupled in series with low-side switch $T_{la}$. In the first half bridge, a gate of high-side switch $T_{ha}$ is coupled to the output of gate driver $GD_{ha}$, a drain terminal of high-side switch $T_{ha}$ is coupled to power supply $V_{sup}$, and a source terminal of high-side switch $T_{ha}$ is coupled to a drain terminal of low-side switch $T_{la}$. A gate of low-side switch $T_{la}$ is coupled to an output of gate driver $GD_{la}$, and a source of low-side switch $T_{la}$ is coupled to the lower potential terminal (e.g., electrical ground) via a shunt resistor $R_a$. The source terminal of high-side switch $T_{ha}$ connects with the drain terminal of low-side switch $T_{la}$ at node $P_a$, which is also referred to phase node $P_a$. The topologies of the second half bridge and the third half bridge are similar to that of the first half bridge, thus are not repeated here. As illustrated in FIG. 1, the three phases of three-phase motor 101 are coupled to phase nodes $P_a$, $P_b$ and $P_c$, respectively, via three electrically conductive paths (e.g., electrical wires) 110, 120 and 130. In another embodiment, the shunt resistors are located in the source path or in the drain path of the high-side switches.

AC motor 101 may be any kind of multi-phase motors (e.g., more than three phases), and a three-phase motor is merely an example. AC motor 101 may be a synchronous motor, an induction motor, a switched reluctance motor, or the like. The disclosed embodiments use three-phase motors as examples, with the understanding that other types of AC motors may also be used and are within the scope of the present disclosure.

As illustrated in FIG. 1, shunt voltage $V_a$ across shunt resistors $R_a$, shunt voltage $V_b$ across shunt resistors $R_b$, and shunt voltage $V_c$ across shunt resistors $R_c$ are sent to an ADC module 140 and converted into digital values. ADC module 140 may include one or more suitable analog-to-digital converter. For example, ADC module 140 may have three sigma-delta ADCs, with each of the three sigma-delta ADCs converting one of the input analog signals (e.g., shunt voltages $V_a$, $V_b$ and $V_c$) into digital values. The output of ADC module 140 represents the measured values of the input analog signals (e.g., $V_a$, $V_b$ and $V_c$), which measured values are sent to a PWM module 150 via data path 143. Data path 143 is a multi-bit data path in some embodiments. PWM module 150 controls the operation of three-phase motor 101 by generating PWM pulses, also referred to as PWM control signals (e.g., $PWM_{ha}$, $PWM_{hb}$, $PWM_{hb}$, $PWM_{hb}$, $PWM_{hc}$, and $PWM_{lc}$) that control the operation of the high-side switches (e.g., $T_{ha}$, $T_{hb}$ and $T_{hc}$) and low-side switches (e.g., $T_{la}$, $T_{lb}$ and $T_{lc}$), which in turn control the voltage and/or current supplied to three-phase motor 101. The PWM pulses generated by PWM module 150 may be buffered by gate drivers (e.g., $GD_{ha}$, $GD_{la}$, $GD_{hb}$, $GD_{lb}$, $GD_{hc}$, $GD_{lc}$), and the outputs of the gate drivers are used to drive the high-side switches and low-side switches. PWM module 150 may be or include a micro-processor, a micro-controller, an application-specific integrated-circuit (ASIC) for motor control, as examples. PWM module 150 monitors the status of three-phase motor 101 by, e.g., monitoring measured values of shunt voltages $V_a$, $V_b$, and $V_c$ supplied by ADC module 140, and generates PWM pulses to control the operation of three-phase motor 101, in some embodiments. PMW module 150 may control the operation of ADC module 140 by, e.g., adaptively modifying the configuration of ADC module 140 in response to different operating conditions of three-phase motor 101 via control path 145, which control path 145 may be a multi-bit data path. Details regarding adaptively modifying the configuration of ADC module 140 are discussed hereinafter.

In the example of FIG. 1, high-side switches $T_{ha}$, $T_{hb}$ and $T_{hc}$ and low-side switches $T_{la}$, $T_{lb}$ and $T_{lc}$ are illustrated as metal-oxide-semiconductor field-effect transistors (MOS-FETs). Other suitable power switches, such as insulated-gate bipolar transistors (IGBTs), may also be used. The three-phase motor system 100 having three half bridges is merely an example, other typologies for a multi-phase motor system may also be used. The principle of adaptively modifying the configuration of ADC in response to varying operating conditions in a signal acquisition system (e.g., an analogy-to-digital conversion system) disclosed herein, may be applied to other applications besides motor control applications. In addition, in embodiments of the present disclosure, three analog input signals (e.g., three shunt voltages) are converted into digital values in parallel, one skilled in the art will appreciate that the adaptive signal acquisition systems and methods disclosed herein can be used for any number of analog input signals, for example, less or more than three analog input signals. In another embodiment, a signal acquisition system has a single load or a single input value to be measured, and the timing of the measurement depends on the operating condition of the signal acquisition system. In addition, for a three-phase motor system (e.g., motor system 100), it may be possible to only measure phase currents from two of the half-bridges, since the third phase current may be calculated, e.g., using Kirchhoff's law.

In various embodiments, the phase currents (e.g., $I_a$, $I_b$ and $I_c$ that flow in electrical path 110, 120 and 130, respectively) of three-phase motor 101 are measured at the same time. Depending on the structure of the motor or the load, phase currents can vary between about 5% to about 10%, or even more of their nominal value over one PWM period (e.g., a period from $T_1$ to $T_7$ in FIG. 2), due to the switching activities of the high-side switches and low-side switches. Precision of torque control of motor 101 could be improved if the measurement time of all phase currents are close to each other, or ideally at the same time. Therefore, the phase currents (e.g., $I_a$, $I_b$ and $I_c$) of all three phases are measured in parallel and/or at the same time, in some embodiments. For example, three ADCs may be used to convert $I_a$, $I_b$ and $I_c$, or shunt voltages $V_a$, $V_b$, and $V_c$, into digital values in parallel. A same control signal (e.g., a same clock signal, a same counter, and/or a same enable signal) may be used to control the three ADCs (e.g., three sigma-delta ADCs) so that the three ADCs convert the analog voltages into digital values in parallel, sometimes also referred to as concurrently. In some embodiments, the sampling time of the three ADCs are synchronized, or are substantially the same.

Figure 2:
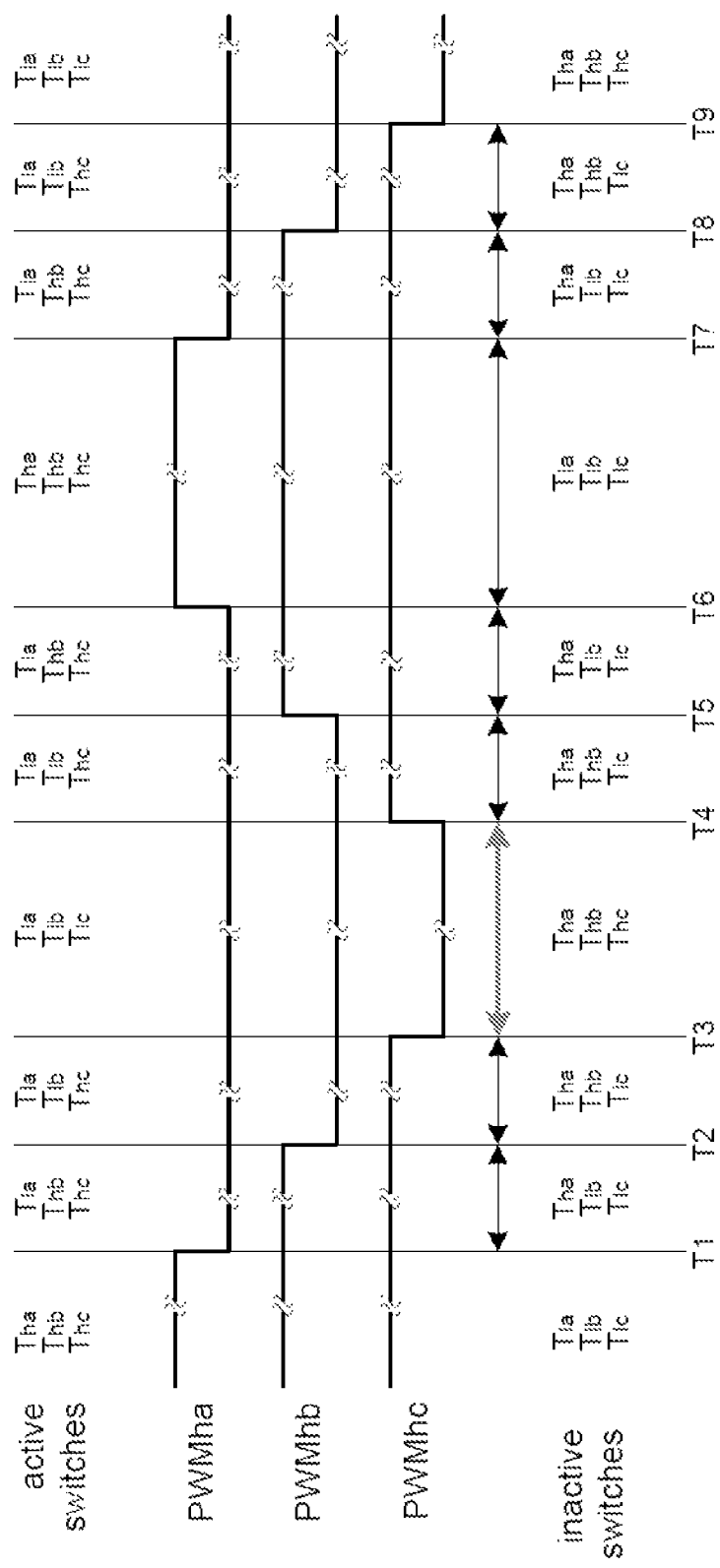
FIG. 2 illustrates a time diagram for a three-phase motor system.

Still referring to FIG. 1, each phase current is measured by converting the corresponding shunt voltage into digital values, when the corresponding low-side switch is active (e.g., turned on) and the phase current flows through the shunt resistor. For example, to measurement phase current $I_a$, shunt voltage $V_a$ across shunt resistor $R_a$ is measured when low-side switch $T_{la}$ is active (e.g., transistor $T_{la}$ is on). As discussed above, all three phase currents $I_a$, $I_b$ and $I_c$ are measured or sampled concurrently, therefore, all three shunt voltages $V_a$, $V_b$ and $V_c$ are converted into digital values in a time interval suitable for measurement (also referred to as a measurement window), in some embodiments. The time interval between time $T_3$ and time $T_4$ in FIG. 2 illustrates a measurement window when all low-side switches are active. More details of the measurement window will be discussed hereinafter with references to FIGS. 2, 3A and 3B.

In the example of FIG. 1, shunt resistors $R_a$, $R_b$ and $R_c$ are located in the low-side current path (e.g., between a low-side switch and a reference voltage level such as electrical ground), therefore phase currents flow through the shunt resistors when the low-side switches are active. Skilled artisans will appreciate that shunt resistors may be located in high-side current path (e.g., between a high-side switch and power supply $V_{sup}$), in which case the phase currents may be measured when the high-side switches are active (e.g., turned on). The present disclosure uses examples where shunt resistors are in the low-side current path, with the understanding that the principles disclosed herein can be adapted for systems having shunt resistors in the high-side current path.

FIG. 2 illustrates a timing diagram of the activation and deactivation of the high-side switches and low-side switches in a center-aligned PWM mode for the three-phase motor system 100 illustrated in FIG. 1. In a center-aligned PWM mode, no two edges of PWM control signals that correspond to different duty cycles of the power switches (e.g., high-side switches and low-side switches) align, and the edges of PWM signals are symmetric with each other. Duty cycle may refer to the ratio between the on-time of a switch and the sum of on-time and off-time (switching period) of the switch. In FIG. 2, PWM control signals $PVM_{ha}$, $PVM_{hb}$ and $PVM_{hc}$ for the high-side switches are shown from time $T_1$ to time $T_9$, with the time interval between $T_1$ to $T_7$ representing a PWM period, and the time interval between $T_7$ to $T_9$ representing the beginning portion of the next PWM period. Each of the time $T_1$, $T_2$, . . . and $T_7$ represents a switching time (e.g., switch from on to off, or switch from off to on) for the power switches. A "high" voltage level shown in FIG. 2 represents the appropriate voltage level to activate the high-side switches (e.g., turn on the high-side transistors), and a "low" voltage level represents the appropriate voltage level to deactivate the high-side switches (e.g., turn off the high-side transistors). In some embodiments, PWM control signals $PVM_{la}$, $PVM_{lb}$ and $PWM_{lc}$ for the low-side switches are complementary of the PWM control signals for the corresponding high-side switches, thus are not shown in FIG. 2. In another embodiment, an edge-aligned mode is used instead of a center-aligned mode. In the edge-aligned mode, high-side switches have the same switching state (e.g. on or off) and low-side switches have the same switching state (e.g., opposite to the switching state of the high-side switches). At the end of a switching period in the edge-aligned mode, the switching state of the high-side switches and the low-switches are changed with respect to their switching state at the start of the switching period. To start a new switching period, the high-side switches and low-side switches switch back to their respective original switching state at the beginning of the switching period. Compared to center-aligned mode, each of the power switches in edge-aligned mode switches on and off twice as often than in center-aligned mode to achieve a similar current ripple over each switching period. In the edge-aligned mode, the time interval that can be used for measuring the phase currents is only half of the time interval in center-aligned mode, in some embodiments. In some embodiments, PWM patterns may be generated in a different way, e.g., the PWM signal for one phase may be shifted by a phase shift angle (asymmetrically to the others) and a measurement window may be defined with a different timing.

As shown in FIG. 2, between time $T_1$ and $T_2$, and between time $T_5$ and $T_6$, two high-side switches (e.g., $T_{hb}$ and $T_{hc}$) and one low-side switch (e.g., $T_{la}$) are active. Between time $T_2$ and $T_3$, as well as between time $T_4$ and $T_5$, two low-side switches (e.g., $T_{la}$ and $T_{lb}$) and one high-side switch (e.g., $T_{hc}$) are active. During the time interval between time $T_3$ and $T_4$, all three low-side switches (e.g., $T_{la}$, $T_{lb}$ and $T_{lc}$) are active. For the three-phase motor system 100 illustrated in FIG. 1, phase currents $I_a$, $I_b$, and $I_c$ flow through shunt resistors $R_a$, $R_b$ and $R_c$ respectively during the time interval between time $T_3$ and $T_4$. Consequently, the time interval between time $T_3$ and $T_4$ forms a measurement window during which phase currents $I_a$, $I_b$ and $I_c$ can be measured in parallel by measuring shunt voltages $V_a$, $V_b$ and $V_c$. Note that shunt voltages are directly related to phase currents by equation $V_x = I_x \times R_x$, where x=a, b, or c. Skilled artisans will appreciate that for three-phase motor systems having shunt resistors in the high-side path, the time interval between time $T_6$ and $T_7$ forms a measurement window during which phase currents $I_a$, $I_b$ and $I_c$ can be measured in parallel. To avoid a shoot-through current through the high-side switches and the low-side switches when they change their switching states, a minimum dead-time (e.g., a time interval during which a high-side switch and a corresponding low-side switch are both deactivated) between the deactivation of one switch and the activation of the other switch is introduced, in some embodiments. A switch may switch on faster than switching off, in some embodiments. Although there is a dead-time between the activation and deactivation of power switches, such a dead-time is usually negligible when compared with the duration of each switching cycle (e.g., time interval between two adjacent switching times such as $T_1$, $T_2$, . . . $T_7$). Therefore, the dead-time is not illustrated in FIGS. 2, 3A and 3B.

The time diagram shown in FIG. 2 is merely an example. The sequence of switching for the phases of the three-phase motor depends on the rotor position, and the phases change their roles over one revolution of the rotor. Therefore, other timing diagrams are possible, but the principle disclosed herein is applicable to any time diagrams. In the discussion that follows, a PWM period from time $T_1$ to $T_7$ may also be referred to as a measurement cycle.

FIGS. 3A and 3B illustrate two different measurement windows under different operating conditions of motor system 100 shown in FIG. 1. In some embodiments, when a low torque is demanded of three-phase motor 101, the switching times $T_1$, $T_2$ and $T_3$, as well as switching times $T_4$, $T_5$ and $T_6$, are close to each other, resulting in a large measurement window $MW_1$ within a PWM period W, as illustrated in FIG. 3A. Note that in FIG. 3A, the duration of measurement window $MW_1$ (sometimes referred to as the measurement window size) is chosen to be shorter than the duration between time $T_3$ and $T_4$ ($T_3$ and $T_4$ are not labeled in FIG. 3A, see FIG. 2 for label). This allows for a measurement delay $S_1$ between time $T_3$ and the start of measurement window $MW_1$. The measurement delay $S_1$ may be used as a settling time for the phase currents after the switching of a power switch (e.g., to reduce the impact of switching noise on the current measurement), and/or as a settling time of the ADC measurement unit to allow settling of bias currents in analog parts or the compensation of group delays in digital filters. As a result, within measurement window $MW_1$, the analog signal (e.g., shunt voltage) to be measured has settled down and can be accurately measured. Measurement delay $S_1$ is non-zero in the example of FIG. 3A. In other embodiments, a zero value for measurement delay $S_1$ is used. FIG. 3A also illustrates a margin $m_1$ between the end of measurement window $MW_1$ and time $T_4$. Margin $m_1$ has a non-zero value in the example of FIG. 3A. In other embodiments, margin $m_1$ is zero. The delay between the start of PWM period W and the start of measurement window $MW_1$ is referred to as a start delay and is denoted by $SD_1$. In some embodiments, the phase current is measured at a well-defined point of time between $T_3$ and $T_4$, e.g., at a point where a phase current is close to its average value. The start of the measurement window may be controlled by the start delay $SD_1$ to obtain a conversion result at a pre-determined point of time between $T_3$ and $T_4$.

FIG. 3B illustrates the measurement window when a high torque is demanded of three-phase motor 101. For a high torque operating condition, the switching times $T_1$, $T_2$ and $T_3$, as well as switching times $T_4$, $T_5$ and $T_6$, are spaced apart more than the low torque operating condition, resulting in a small measurement window $MW_2$ within the PWM period W, as illustrated in FIG. 3B. In various embodiments, the duration of measurement window $MW_2$ under high torque conditions is smaller than the duration of measurement window $MW_1$ under low torque conditions. Similar to FIG. 3A, measurement window $MW_2$ has a measurement delay $S_2$ and a margin $m_2$, and the start delay of measurement window $MW_2$ is denoted as $SD_2$. Start delay $SD_2$ may or may not be the same as start delay $SD_1$ in FIG. 3A. For example, if start delay $SD_2$ is used to compensate for the group delay of a decimation filter, it may differ from delay $SD_1$ when the decimation filter characteristics change (e.g. change of the decimation factor or the filter order) or when the measurement window changes.

Figure 4:
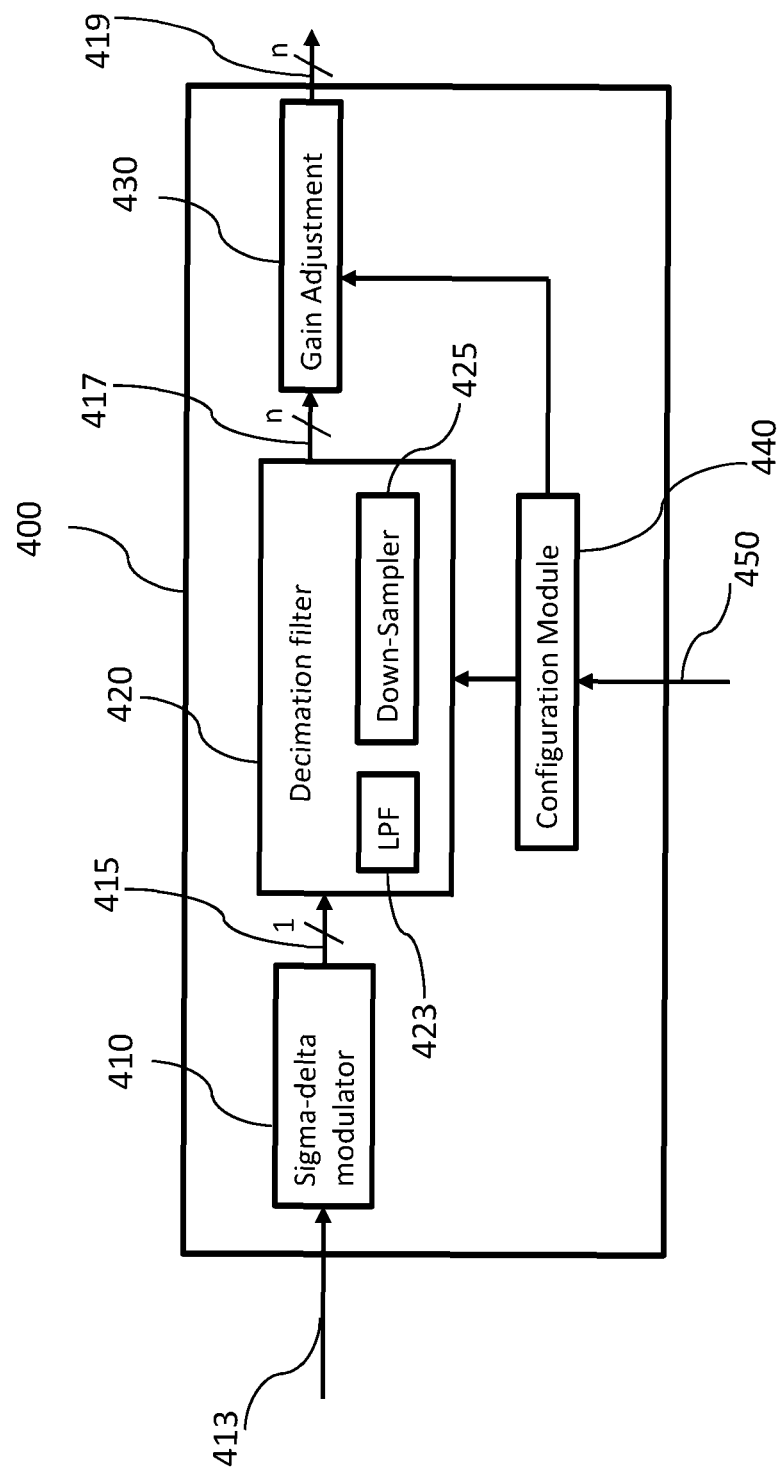
FIG. 4 illustrates a block diagram of a reconfigurable sigma-delta ADC.

FIG. 4 illustrates a block diagram of an embodiment sigma-delta ADC 400. An analog input signal (e.g., a shunt voltage) is measured by converting the analog input into digital values using, e.g., sigma-delta ADC 400, in some embodiments. As illustrated in FIG. 4, embodiment sigma-delta ADC 400 includes sigma-delta modulator 410, decimation filter 420, gain adjustment module 430 and configuration module 440. Sigma-delta modulator 400 samples the analog input signal at input terminal 413 at a sampling frequency $f_s$ and turns the analog input signal into a digital stream (e.g., a sequence of digital data) at output 415. In some embodiments, modulator 410 is set to a power saving mode outside the measurement window. For example, modulator 410 may be disabled (e.g., shut off the modulator, and/or gating a clock signal driving the modulator) for power saving reasons outside the measurement window, and may be enabled inside the measurement window after the start delay (e.g., $SD_1$ and $SD_2$ in FIGS. 3A and 3B). In this case, the start delay may also compensate for the settling time of modulator 410. The digital stream at output 415 of sigma-delta modulator 410 includes a one-bit data stream (e.g., a sequence of digital data with one-bit resolution), in some embodiments, although multi-bit sigma-delta modulator output may be used in other embodiments. The data stream from sigma-delta modulator has a sampling rate $f_s$, which is usually much higher (e.g., two or three orders of magnitude larger) than the Nyquist sampling frequency of the analog input signal. For example, for a three-phase motor system with a phase frequency of about 20 KHz, the sigma-delta modulator sampling frequency $f_s$ may be about 20 MHz. A large sampling frequency allows the use of a simple LPF 423 and could provide more bit resolution at the output of decimation filter 420, in some embodiments. Sigma-delta modulator is known in the art and details are not repeated here.

Still referring to FIG. 4, decimation filter 420 includes two functional modules: a low-pass filter (LPF) 423 and a down-sampler 425 (also referred to as decimator 425). In a real implementation, LPF 423 and down-sampler 425 may be implemented in a same circuit module or hardware module, although LPF 423 and down-sampler 425 may also be implemented in different circuit modules or hardware modules. LPF 423 has a digital cut off frequency of $\pi/D$, where $\pi$ is the normalized digital frequency (in radians/second) corresponding to half of the sampling frequency $f_s$, and D is the decimation factor of decimator 425, in some embodiments. LPF 423 may be built using different type of filters, such as infinite impulse response (IIR) filters, finite impulse response (FIR) filters, Sync filters, comb filters, or the like. LPF 423 reduces or removes frequency components of its input signal (e.g., the one-bit digital stream) above the digital frequency $\pi/D$, and prevents aliasing in the decimation process when the output of LPF is down-sampled (also referred to as decimated) by down-sampler 425. Down-sampler 425 reduces the sampling frequency of a digital signal by a factor of D (also referred to as decimation factor D, decimation rate D, and down-sampling factor D). Decimation filter 420 may include multiple stages of processing (not shown in FIG. 4), with each stage having an LPF and a decimator. Besides removing frequency components of the digital stream 415 of the modulator that is above the digital frequency $\pi/D$, LPF 423 also functions to "average" the input signal, thereby converting the digital stream 415 into multi-bit digital values. The multi-bit digital values from LPF 423 is decimated by a factor of D by decimator 425, and n-bit digital values are sent out at data path 417 of decimation filter 420. Decimation filter 420 is sometimes referred to as sigma-delta demodulator 420.

FIG. 4 shows a gain adjustment module 430 coupled to the output of decimation filter 420. Gain adjustment module 430 includes a multiplier that multiplies the output of decimation filter 420 by a scaling factor, in some embodiments. In other embodiments, gain adjustment module 430 includes a divider unit to output a normalized data format. With either a multiplier or a divider, gain adjustment scales the output of decimation filter 420 by a scaling factor. Output 419 of sigma-delta ADC 400 corresponds to the output of gain adjustment module 430. Configuration module 440 in FIG. 4 sets the configurations of decimator filter 420 and the scaling factor of gain adjustment module 430, in some embodiments. An external interface 450 allows configuration module 440 to be controlled by a controller, e.g., PWM module 150 in FIG. 1.

Figure 5:
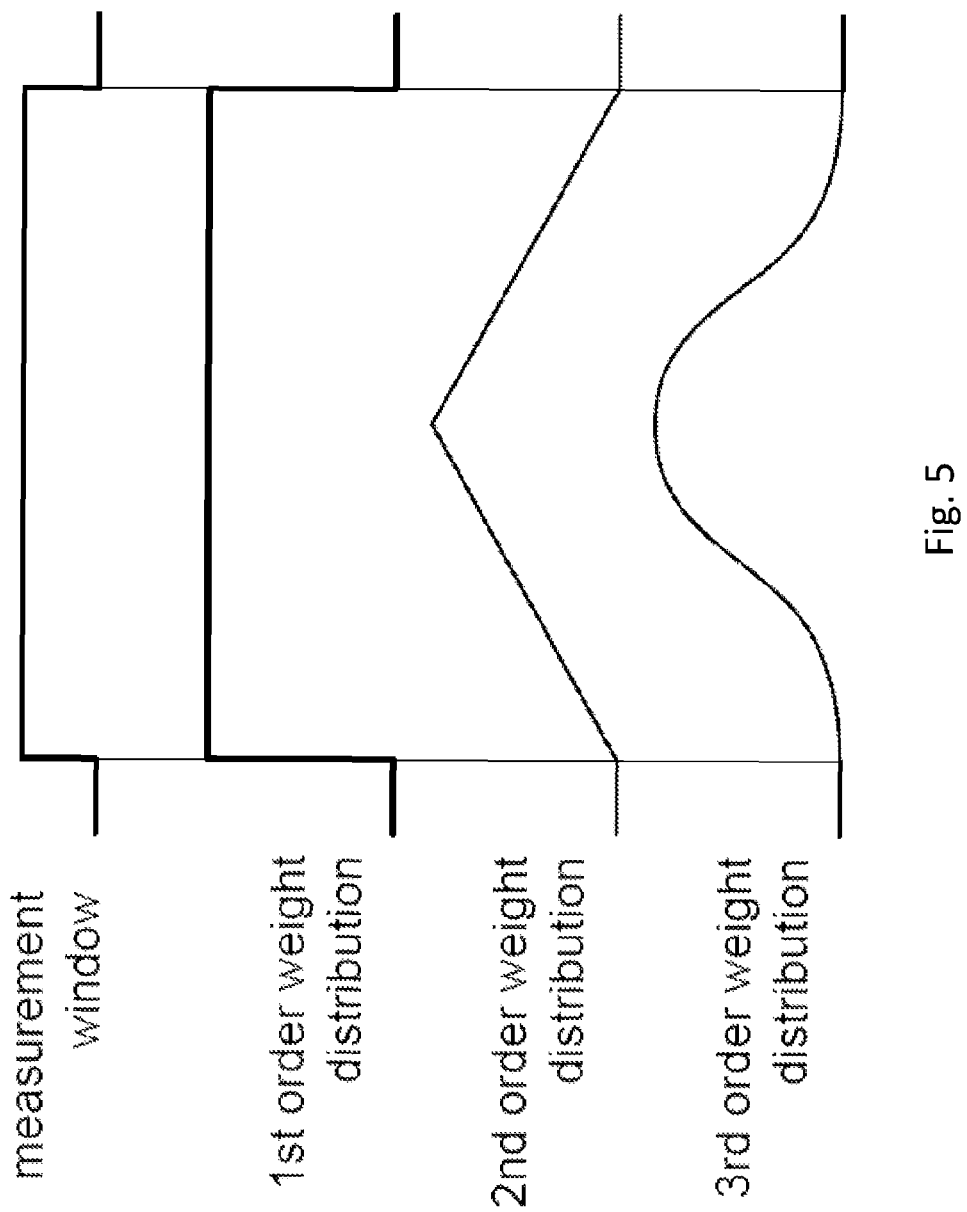
FIG. 5 illustrates weight distributions for different low-pass filters of a sigma-delta ADC.

FIG. 5 illustrates some exemplary weight distributions for LPF filter 423 with different orders. The order of LPF 423 is related to the number of delay elements in the structure of LPF 423, in some embodiments. In the example of FIG. 5, a measurement window is shown at the top, the weight distribution (e.g., the magnitude of the filter coefficients) of LPF 423 is shown for a first order LPF, a second order LPF and a third order LPF. As illustrated in the example of FIG. 5, a first order LPF may have a uniform weight distribution, meaning that all digital samples from sigma-delta modulator 410 are weighted equally by LPF 423 in calculating the output of LPF 423. In contrast, the weight distribution of a second order LPF may have a triangular shape, with the digital sample in the middle of the filter being weighted the most in calculating the output of LPF 423. For a third order LPF, the weight distribution may be non-linear, but may still have a highest weight at the center of the filter.

Figure 6:
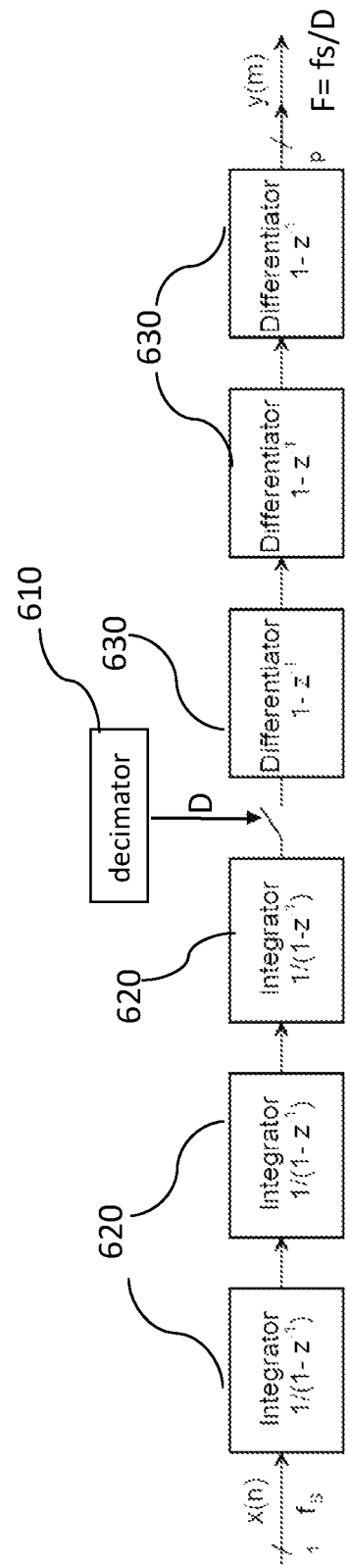
FIG. 6 illustrates a decimation filter.

FIG. 6 illustrates an example of decimation filter 420 having an infinite impulse response (IIR) structure. In particular, a $Sinc^3$ filter is illustrated in FIG. 6. As shown in FIG. 6, a $Sinc^3$ filter 420 can be implemented by cascading three stages of accumulators 620 (also referred to as integrators) operating at a high sampling rate $f_s$, followed by three stages of cascaded differentiators 630 operating at a low sampling rate $f_s/D$, where D is the decimation factor, with a decimator 610 having decimation factor D disposed between accumulators 620 and differentiators 630. In FIG. 6, the LPF and the decimator of a decimation filter are implemented together in one circuit module, therefore the $Sinc^3$ filter is an example of decimation filter 420 in FIG. 4. The structure illustrated in FIG. 6 can be generalized for any $Sinc^k$ filters, where K=1, 2, 3, 4 . . . , by cascading K stages of accumulators 620, followed by K stages of cascaded differentiators 630, with a decimator 610 having decimation factor D disposed between accumulators 620 and differentiators 630. The order of the LPF filter of $Sinc^k$ filters 420 is defined as K, in some embodiments.

A $Sinc^k$ filter may be implemented as an IIR filter, which can be approximated by a finite impulse response (FIR) filter that calculates a weighted average of D×K input samples (e.g., D×K consecutive input samples with sampling frequency $f_s$) to produce an output value, where D is the decimation factor and K is the order of the LPF filter. In motor system 100 of FIG. 1, phase currents flow through all of the shunt resistors (e.g., $R_a$, $R_b$ and $R_c$) during certain time (e.g., the measurement window) of the measurement cycle. Therefore, the time interval occupied by D×K input samples that are used in calculating the weighted average are designed to fit within the measurement window, in some embodiments. For a filter that averages over N input samples, the time interval occupied by the N input samples are referred to as the span of the filter. The span of the $Sinc^k$ filter, which may be calculated by $D \times K/f_s$, is less than or equal to the duration of the measurement window, in some embodiments. The decimation factor D is sometimes referred to as the over-sampling rate (OSR) of decimation filter 420, or the over-sampling rate (OSR) of sigma-delta ADC 400.

As discussed above, LPF 423 averages over multiple input digital samples (e.g., one-bit digital samples from sigma-delta modulator 410) to produce multi-bit output values. The bit resolution of LPF 423 is the same as the bit resolution of decimator filter 420, in some embodiments. In general, the more input digital samples are averaged by LPF 423 to produce an output value, the higher is the bit resolution of the output value. For the $Sinc^k$ filter illustrated in FIG. 6, the bit resolution of the output of the decimation filter is determined by $K * \log_2 D$, where K is the order of the LPF filter, and D is the decimation factor.

Figure 7:
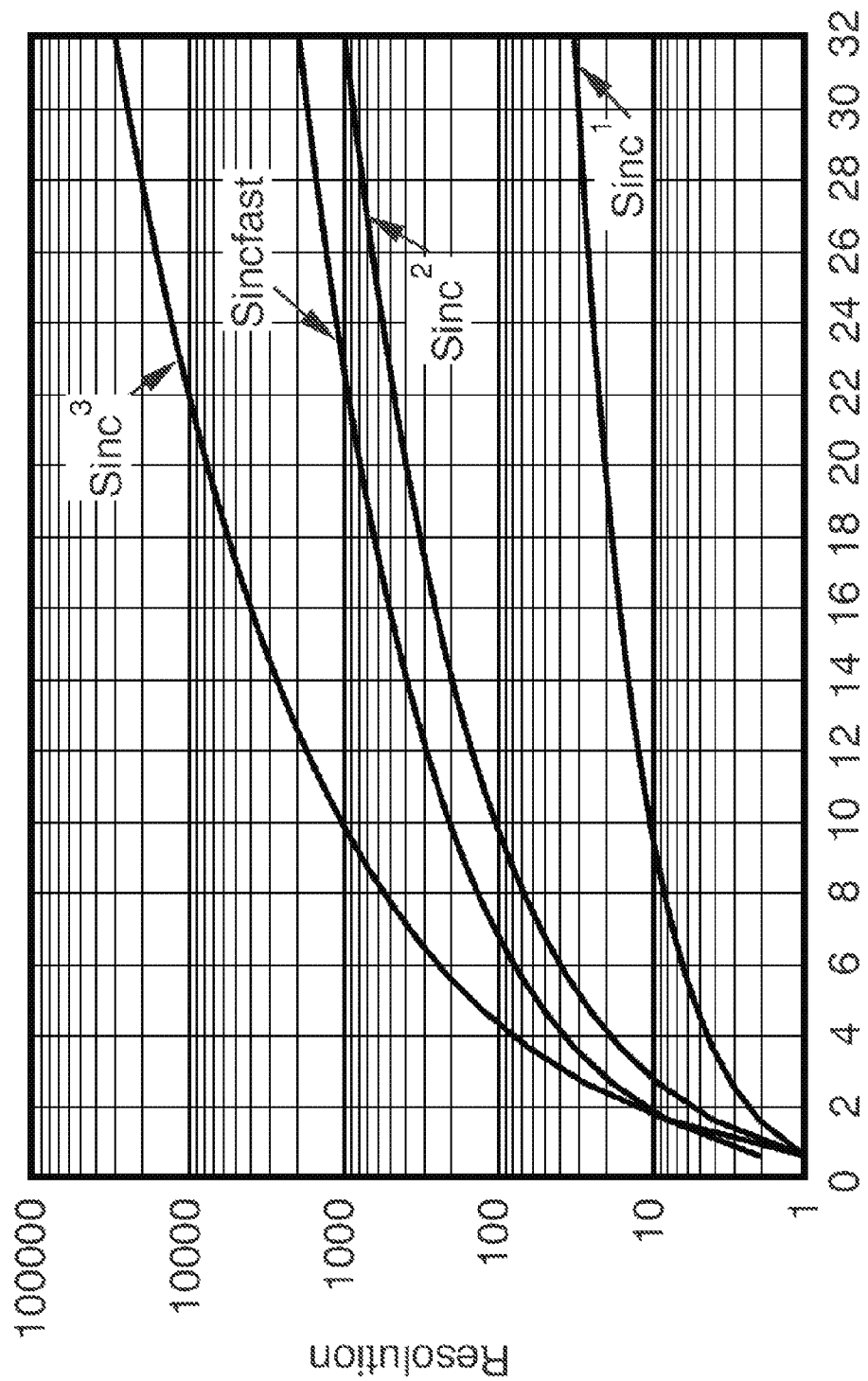
FIG. 7 illustrate the numeric output range versus decimation factor for different types of decimation filters.

FIG. 7 illustrates the maximum output level of the decimation filter 420 versus the decimation factor for four different types of decimation filters. The values along the x-axis represent the decimation factor D, and the values along the y-axis represent the maximum output level (e.g., maximum output value of the decimation filter for a one-bit input data stream comprising 1's and 0's). For example, for a $Sinc^3$ filter with a decimation factor of 32, the maximum output level is 32,768, which corresponds to about a 12-bit resolution for the output value of the decimation filter.

The duration of the measurement window changes under different operating conditions of the motor system. For example, when the torque of the motor is high, the measurement window is small; when the torque of the motor is low, the measurement window is large, as illustrated in FIGS. 3A and 3B. In embodiments of present disclosure, the order of LPF 423 and/or the decimation factor D of decimator 425 are adjusted adaptively in response to changes of the measurement window (e.g., changes in the duration of the measurement window), such that the span of LPF 423 fits within the duration of the measurement window. This ensures that there are enough digital samples generated by sigma-delta modulator in the measurement window to be averaged by LPF 423 to produce an output value. Consider an example where a measurement window of 10 μs is available for a motor system under a low torque condition. A third order $Sinc^3$ filter (K=3) with a decimation factor of D=64 is used, and a sampling frequency for the sigma-delta modulator is 20 MHz. Recall that the equivalent FIR filter of the $Sinc^3$ filter averages over D×K=64×3=192 samples, which corresponds to 9.6 μs, thus the above configurations for decimation filter 420 (e.g., $Sinc^3$ filter with a decimation factor 64) could be used for a measurement window of 10 μs. When an increase in the torque of the motor causes the duration of the measurement window to decrease to, e.g., 2 μs, the order of the LPF and/or the decimation factor of the decimator can be adjusted (e.g., decreased) to reduce the span of the LPF filter accordingly. For example, consider the $Sinc^3$ filter with a sampling frequency of 20 MHz in the above example. To accommodate the smaller measurement window, the decimation factor D could be reduced from 64 to 8, resulting in a smaller span of LPF equal to the time interval occupied by 8×3=24 samples, which is about 1.2 μs. Conversely, when the duration of the measurement window increases, the order of the LPF and/or the decimation factor of the decimator may be adjusted (e.g., increased) to increase the span of the LPF filter accordingly.

In some embodiment motor systems, high torque corresponds to high phase currents, and low torque corresponds to low phase currents. In the above example, low phase currents (e.g., low torque and large measurement window) allow for a longer span of the LPF filter, and high phase currents (e.g., high torque and small measurement window) allow for a smaller span of the LPF filter. FIG. 7 shows that a longer span of the LPF filter may provide higher bit resolution for the output of the LPF and a shorter span of the LPF filter may provide lower bit resolution for the output of the LPF. Therefore, the numerical resolution (e.g., bit resolution) for the measured values of the analog signals (e.g., phase currents, or shunt voltages) changes with the signal levels (e.g., phase current values or shunt voltage values) of the analog input signals, in some embodiments. For example, a small analog input signal (e.g., a phase current under low torque condition) may have a high bit resolution (e.g., 16-bit resolution) after being converted into digital values by, e.g., a sigma-delta ADC, and a large input analog signal (e.g., a phase current under high torque condition) may have a low-bit resolution (e.g., 8-bit resolution) after being converted into digital values by, e.g., a sigma-delta ADC. In some embodiments, the signal level (e.g., current value or voltage value) of the analog input signal determines the condition (e.g., measurement window size, location of the measurement window within a measurement cycle, and signal level of analog input signal) of the measurement window, thus is used to determine the configuration of the sigma-delta ADC (e.g., order K for LPF 423, decimation factor D for decimator 425, gain F and offset OFFS for the gain adjustment module 430). The signal level of the analog input signal may also be used to determine the configuration for measurement of the motor system (e.g., start delay $SD_1$).

In some embodiments, the span of the LPF filter is adjusted (e.g., by adjusting order of the LPF filter and/or decimation factor of the decimator) adaptively such that the span of LPF filter is substantially the same as, while still fit within, the duration of the measurement window, thus maximizing the bit resolution of the output value of the LPF for the given measurement window size. In other embodiments, the span of the LPF filter is adjusted adaptively such that the span of LPF filter fit within the duration of the measurement window and provides a pre-determined bit resolution at the output of the LPF filter. In yet other embodiments, the span of the LPF filter is smaller than the duration of the measurement window. For example, when the span of the LPF filter is already long enough to produce output with a desired bit resolution, the span of the LPF filter may remain the same, even if the measurement window size increases.

The disclosed methods above may be advantageously used for measuring phase currents of a motor. As an example, consider an application for automotive steering. When the automobile is moving at high speed, low torque is required of the motor, but precise control of the steering wheel is desired. To precisely control the steering wheel, high precision (e.g., high bit resolution) measurement of the phase currents is needed. Conversely, when the automobile is at low speed (e.g., turning in a parking lot), high torque is required of the motor, but the measurement of phase currents does not need to have high bit resolution. The above disclosed methods can be used to adaptively change the configuration of the decimation filter in response to different operating conditions of the motor system, therefore achieving high bit resolution measurement under low torque condition and low bit resolution measurement under high torque condition. In contrast, a conventional decimation filter having a fixed configuration (e.g., order of filter, decimation factor) may have to be designed with a small filter span such that the span of the decimation filter may fit within a small measurement window, thus may only provide a fixed low bit resolution measurement.

Referring back to FIG. 4 temporarily, decimation filter 420 may only operate during the measurement window, when samples generated by sigma-delta modulator 410 during the measurement window enter decimation filter 420. Decimation filter 420 may be frozen (e.g., not operating) outside the measurement window. Similarly, sigma-delta modulator 410 may be frozen outside the measurement window, which helps to reduce the settling time near the beginning of the measurement window. When enough samples (e.g., D×K samples) generated during the measurement window enter LPF 423, the decimation filter 400 may operate once (instead of operating continuously within the measurement window) to produce a measurement result of the analog signal (e.g., shunt voltage), this is referred to as a single-shot operation mode of the decimation filter. In other embodiments, decimation filter 420 operates continuously within the measurement window, e.g., when there are enough input samples generated during the measurement window to process.

Figure 8:
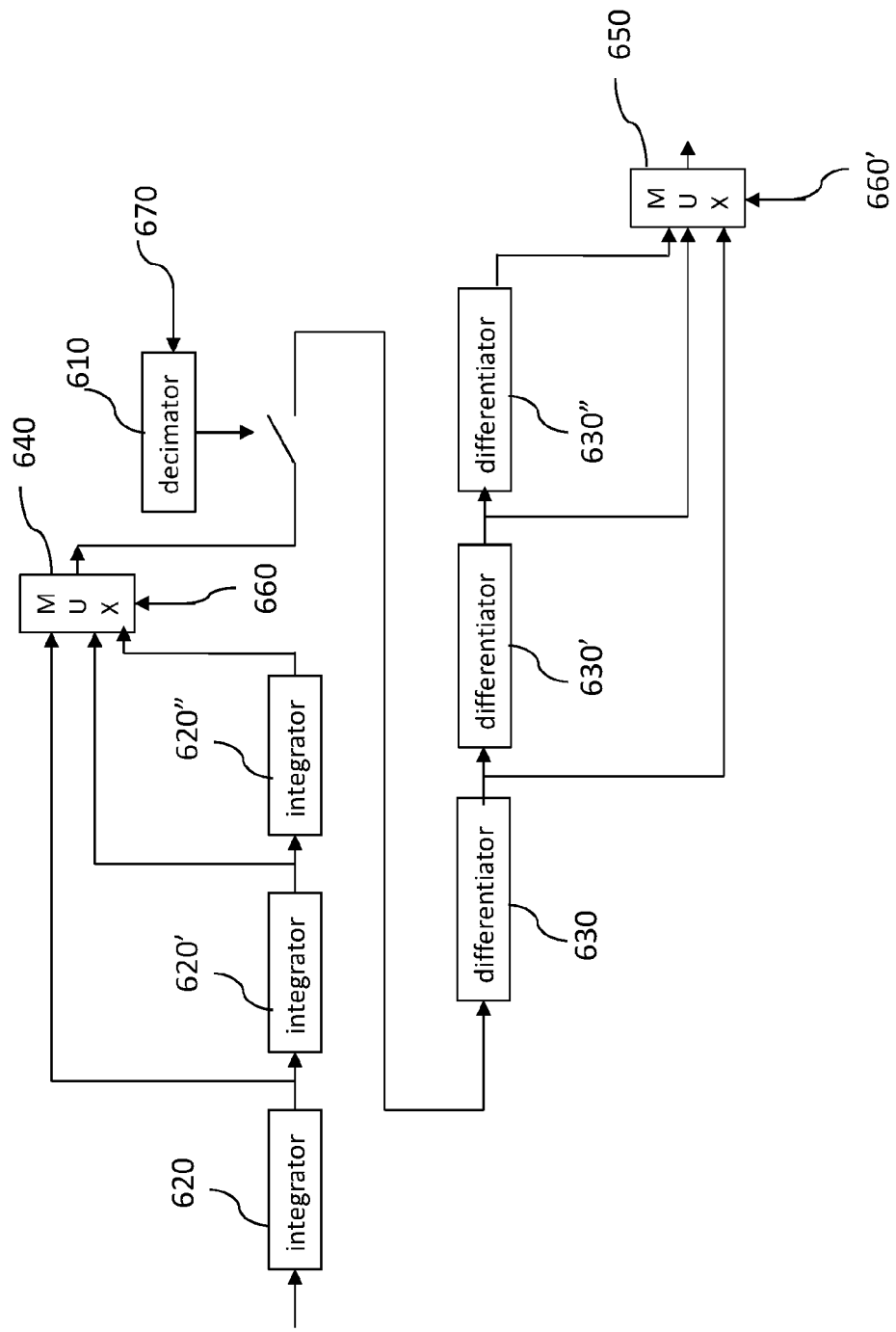
FIG. 8 illustrates a reconfigurable decimation filter.

Various implementations for re-configurable decimation filters are possible. FIG. 8 illustrates a block diagram for a re-configurable decimation filter 800, which is similar to the $Sinc^3$ filter of FIG. 6, but with additional components and connections. For example, outputs of integrators (e.g., 620, 620' and 620") are sent to a multiplexer (MUX) 640 as inputs, and MUX 640 is controlled by a control signal 660 to select one of the inputs as the output of MUX 640. Similarly, outputs of differentiators (e.g., 630, 630' and 630") are sent to MUX 650 as inputs, and MUX 650 is controlled by a control signal 660', which may be the same as control signal 660, to select one of the inputs as the output of MUX 650. Decimator 610 is controlled by control signal 670 to adjust the decimation rate D. In some embodiments, control signals 660 and 660' are configured to select the outputs of MUX 640 and MUX 650 from the K-th integrator and K-th differentiator to form a $Sinc^k$ filter. For example, when output of the first integrator 620 is selected as output of MUX 640, and output of the first differentiator 630 is selected as output of MUX 650, a $Sinc^1$ filter is formed. Similarly, selecting the output of the second integrator 620' and output of the second differentiator 630' forms a $Sinc^2$ filter, and so forth. Skilled artisans will appreciate that more stages of integrators and differentiators could be cascaded to form $Sinc^k$ filters with other orders (e.g., K>3), and MUX 640 and MUX 650 would be modified to accommodate more inputs. In other embodiments, decimation filter 420 may be a software module, e.g., a software module running on a digital signal processor, in which case decimation filter 420 may be easily reconfigured through software selection.

Figure 9:
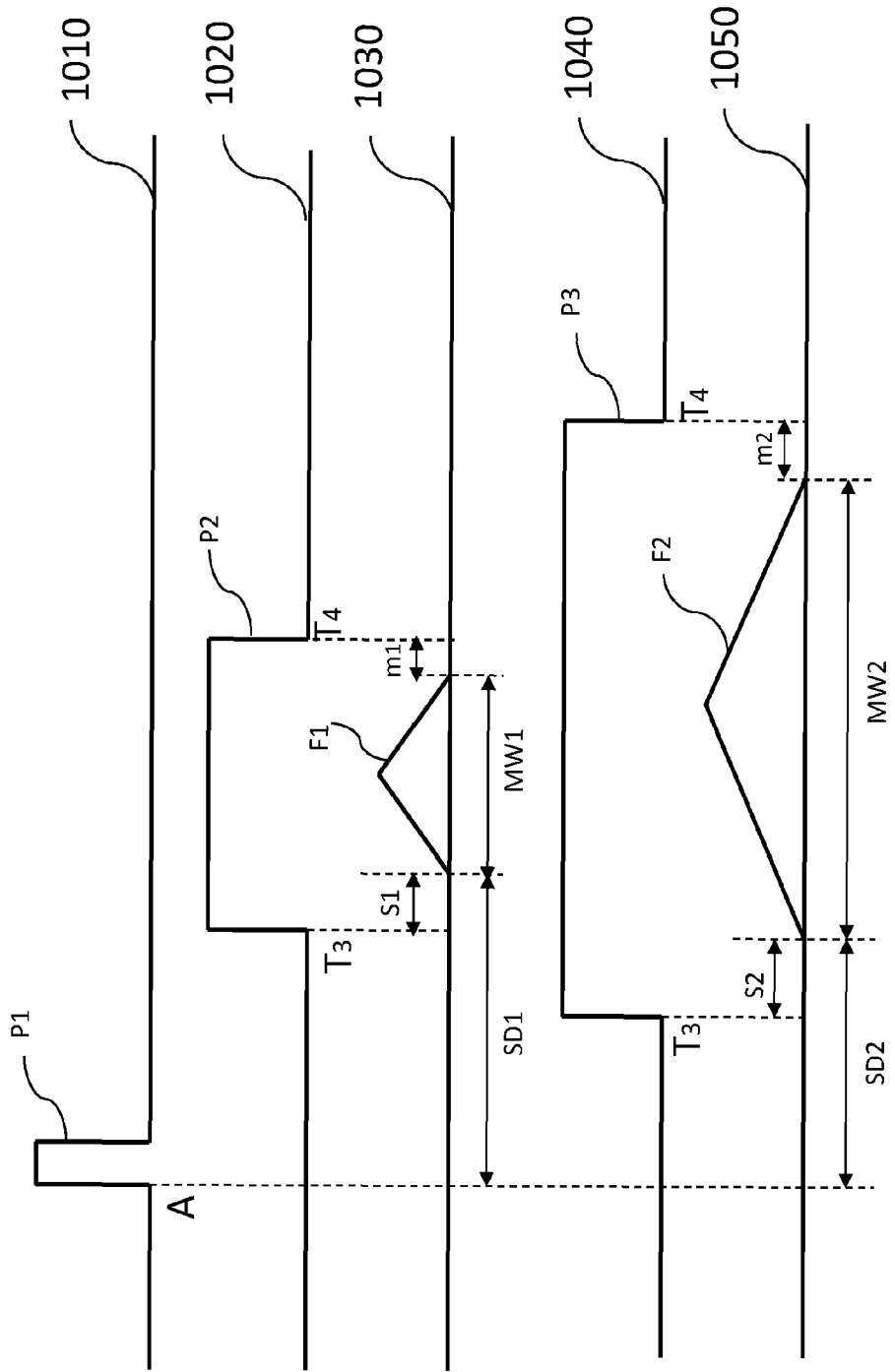
FIG. 9 illustrates the adjustment of the location of the measurement window within a measurement cycle.

FIG. 9 illustrates the adjustment of the location of measurement window within the interval between time $T_3$ and $T_4$. When the duration of the measurement window is smaller than the time interval between time $T_3$ and $T_4$, the location of the measurement window within the time interval can be adjusted to accommodate a minimum measurement delay, e.g., by adjusting start delay $SD_1$. This might be also advantageous since it allows the analog signal to be measured at a desired point within the time interval between $T_3$ and $T_4$. For example, the measurement window may be chosen to be in the middle of the time interval between $T_3$ and $T_4$, by choosing measurement delay $S_1$ to be $(T_4-T_3-MW)/2$, where MW is the duration of the measurement window. Other choices for measurement delay $S_1$ and start delay $SD_1$ are also possible. In some embodiments, the end of measurement delay $S_1$ and the end of start delay $SD_1$ correspond to the same point in time when the first sample of the analog input signal is taken into account (e.g., used in calculating the output of LPF 423) by decimation filter 420. Start delay in a PWM unit may be easily controlled and implemented by using the same time reference (e.g., a same timer) used to generate the PWM control signals. In some embodiments, if the location and the size of the measurement window are kept constant while the duty cycles change, the start delay is also kept constant. In FIG. 9, waveform 1010 illustrates a pulse $P_1$ that indicates the start of a measurement cycle. Waveforms 1020 and 1030 provide an example that illustrates the location of a measurement window $MW_1$ within a short time interval $P_2$ between time $T_3$ and time $T_4$. Waveforms 1040 and 1050 provide another example that illustrates the location of a measurement window $MW_2$ within a long time interval $P_3$ between time $T_3$ and time $T_4$.

Referring back to FIG. 4, adjusting the configuration of decimation filter 420 changes the gain of decimation filter 420, in some embodiments. For example, the DC gain of a $Sinc^k$ filer is $D^K$, where D is the decimation factor, and K is the order of the $Sinc^k$ filter. The gain adjustment module 430 in FIG. 4 scales the output of decimation filter 420 with a scaling factor F. The scaling factor F could be adjusted with the decimation filter 420 (e.g., when the configuration of decimation filter 420 is being adjusted), to maintain a substantially constant gain for sigma-delta ADC 400, in various embodiments. In an exemplary embodiment, the gain of decimation filter 420 with a first configuration (e.g., order K for LPF 423 and decimation factor D for decimator 425) is $G_1$, and the scaling factor of gain adjustment module 430 is set to $F_1$. When the gain of decimation filter 420 changes, e.g., due to a second configuration of decimation filter 420 being set in response to a change in the measurement window, the scaling factor of gain adjustment module is set to $F_2$, such that $G_1 \times F_1$ is substantially the same or similar to $G_2 \times F_2$. Maintaining a substantially constant gain for the sigma-delta ADC 400 makes the output value of the sigma-delta ADC independent of the configurations of the internal modules (e.g., configuration of decimation filter 420 and scaling factor of gain adjustment module 430). By decoupling the output value 419 of sigma-delta ADC 400 from the internal configurations of sigma-delta ADC 400, the output value 419 can be easily interpreted and used by other modules in the system, e.g., without the need to compensate for the different gain factor of decimation filter 420 under different operating conditions. This illustrates another advantage of the present disclosure. In other embodiments, gain adjustment module 430 adds a positive or negative offset OFFS to the scaled decimation filter output, e.g. to represent positive or negative analog input values. The value of OFFS may depend on the available numeric range of the scaled decimation result.

Figure 10:
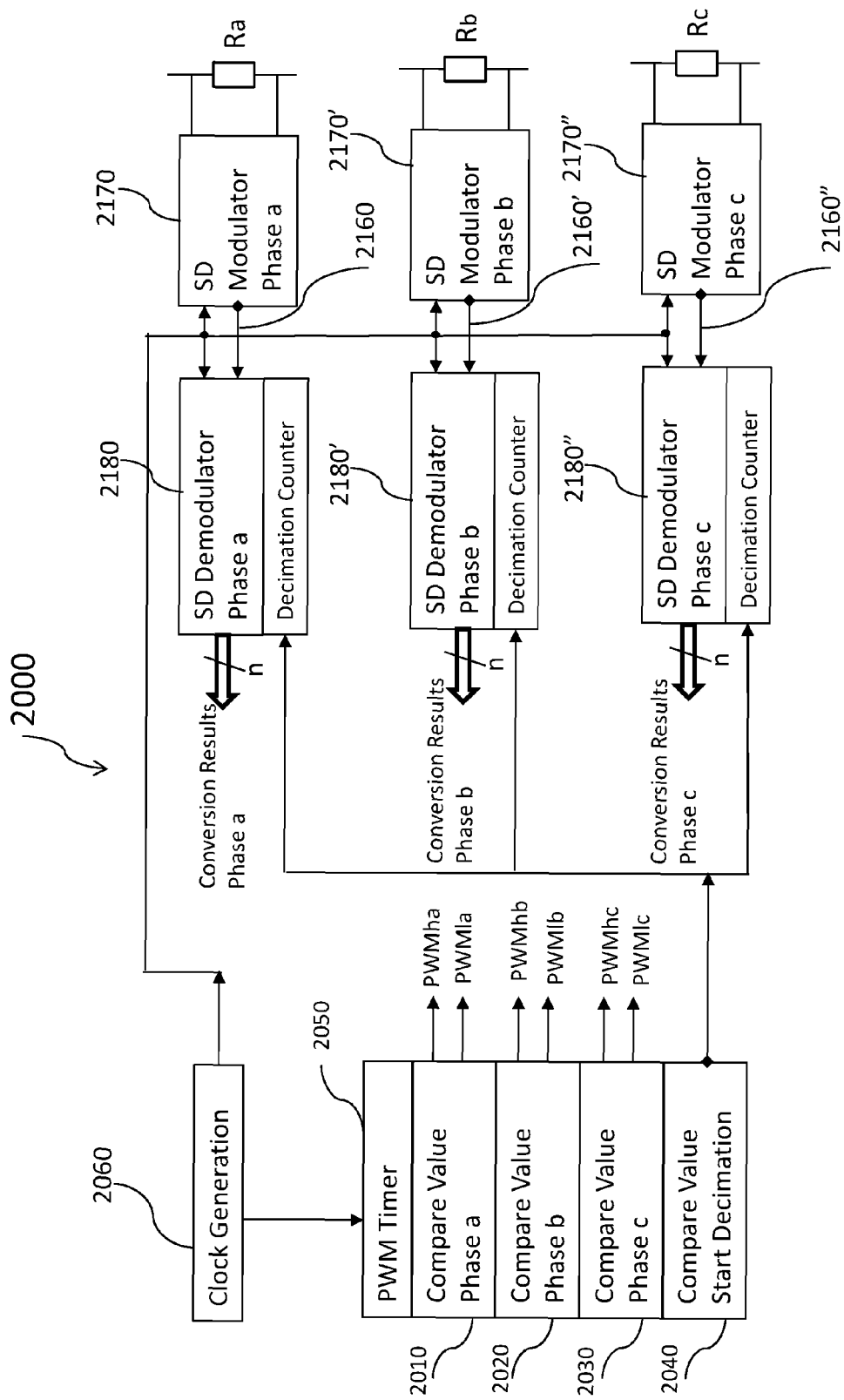
FIG. 10 illustrates a three-phase motor circuit.

FIG. 10 illustrates a three-phase motor circuit 2000. Shunt voltages across resistor $R_a$, $R_b$ and $R_c$ are received by sigma-delta modulators 2170, 2170' and 2170", and converted into streams of digital samples (e.g., one-bit digital samples) 2160, 2160', and 2160", respectively. Sigma-delta demodulators 2180, 2180' and 2180" receive digital samples from the corresponding sigma-delta modulators, and convert the digital samples into multi-bit digital values with desired bit resolution. A modulator clock signal generated by clock generation module 2060 is sent to all sigma-delta modulators and sigma-delta demodulator, in some embodiments. The modulator clock signal may be or include a sampling clock signal to control the operation of the sigma-delta modulators and sigma-delta demodulators. Clock generation module 2060 may also generate a PWM clock signal, which is sent to PWM timer 2050. PWM timer 2050 may count the PWM clock signal to keep track of the measurement cycle and the timing within each measurement cycle. PWM timer 2050 is coupled to three control modules 2010, 2020, and 2030, each of which may be or comprises a PWM control module. Each of the control modules 2010, 2020, and 2030 compares the status of PWM timer 2050 with certain pre-set values for comparison (also referred to as compare values) and generates PWM control signals $PWM_{la}/PWM_{ha}$, $PWM_{lb}/PWM_{hb}$, and $PWM_{lc}/PWM_{hc}$, for the corresponding power switches (see FIG. 1), in some embodiments. Control module 2040 compares the status of PWM timer 2050 with certain pre-set compare values (e.g., timer value corresponding to the end of the measurement window) and generate control signals that control the operation of the sigma-delta demodulators.

In some embodiments, the PWM timer 2050 may be built as an up/down counter, counting between a configurable period value PER and 0. The period value PER defines the number of timing steps for a PWM period, whereas a clock frequency $f_{CLK}$ delivered by clock generation module 2060 to PWM timer 2050 defines the length of each timing step (e.g., timing granularity), in some embodiments. In accordance with an embodiment, the PWM period W for center-aligned PWM mode such as illustrated in FIGS. 3A and 3B is about $2 \times PER/f_{CLK}$. In the example of FIGS. 3A and 3B, PWM timer 2050 may counter up from zero to PER, then count down from PER to zero in one PWM period. The PWM control modules (e.g., 2010, 2020 and 2030) may each compare the counter value of PWM timer 2050 against a compare value. In some embodiments, when the counter value of PWM timer 2050 is within a pre-determined range (e.g., bigger than a pre-set compare value, or smaller than a pre-set compare value), the PWM control signal for a power switch is activated, otherwise it is deactivated. The pre-set compare value may corresponds to the length of the activated time of a PWM control signal, in which case the pre-set compare value may also be referred to as a duty cycle compare value. The compare values may be calculated or adjusted by a system control unit based on the results of the previous phase current measurements and sent to the PWM control modules. For example, in center-aligned PWM mode, the compare values fluctuate around PER/2 and are adjusted based on the measured phase current values.

Still referring to FIG. 10, in some embodiments, sigma-delta modulator 2170 and sigma-delta demodulator 2180 are integrated into a semiconductor device such as a motor-control semiconductor chip. The PWM timer 2050 and control modules 2010, 2020, 2030, and 2040 may also be integrated into the semiconductor chip. In some other embodiments, the sigma-delta modulators and sigma-delta demodulators of all three-phases (e.g., 2170/2170'/2170", 2180/2180'/2180") are integrated into the semiconductor chip. In another embodiment, all components or modules of three-phase motor circuit 2000 are integrated into the semiconductor chip, except for shunt resistors $R_a$, $R_b$ and $R_c$. In yet another embodiment, three-phase motor circuit 2000 is implemented on a control board, e.g., a printed circuit board (PCB).

Figure 11:
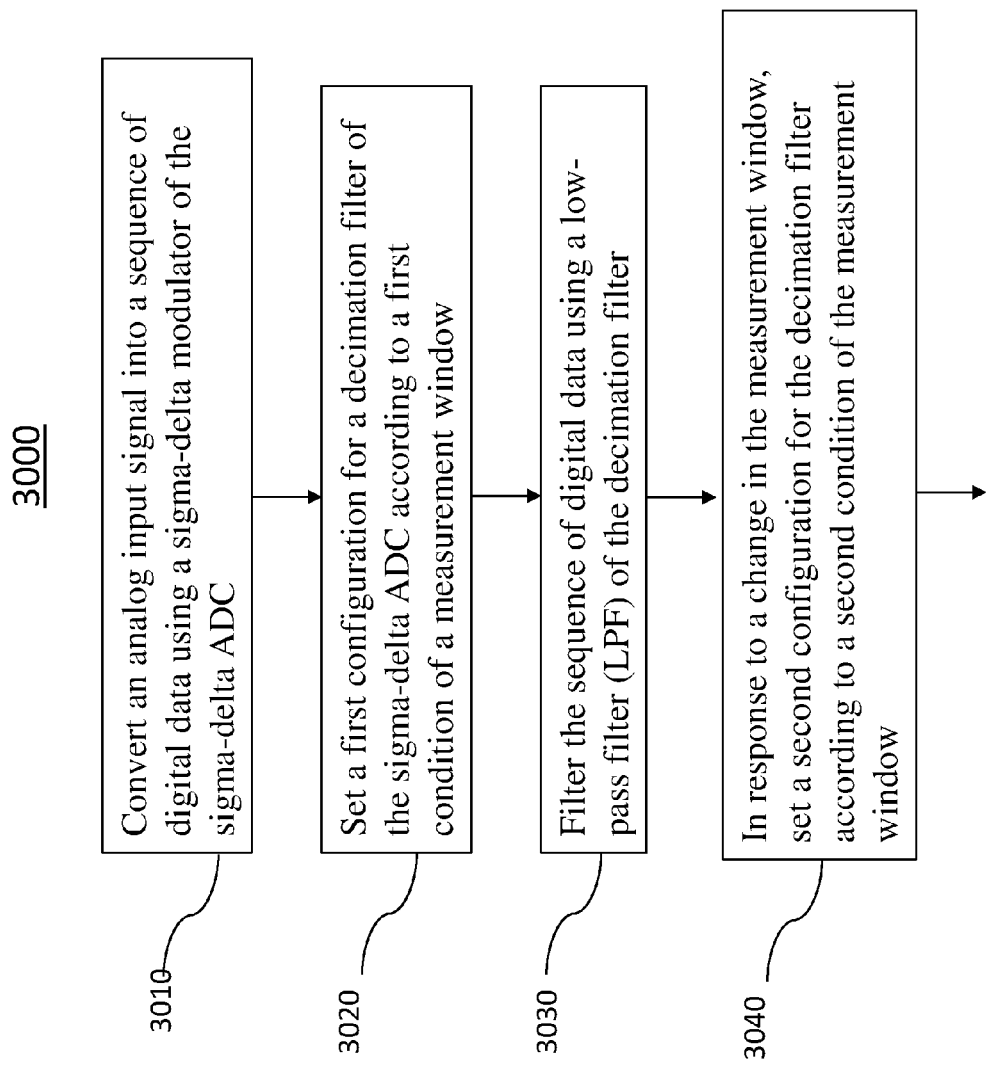
FIG. 11 illustrates a flow diagram for a method of operating a sigma-delta ADC.
Figure 12:
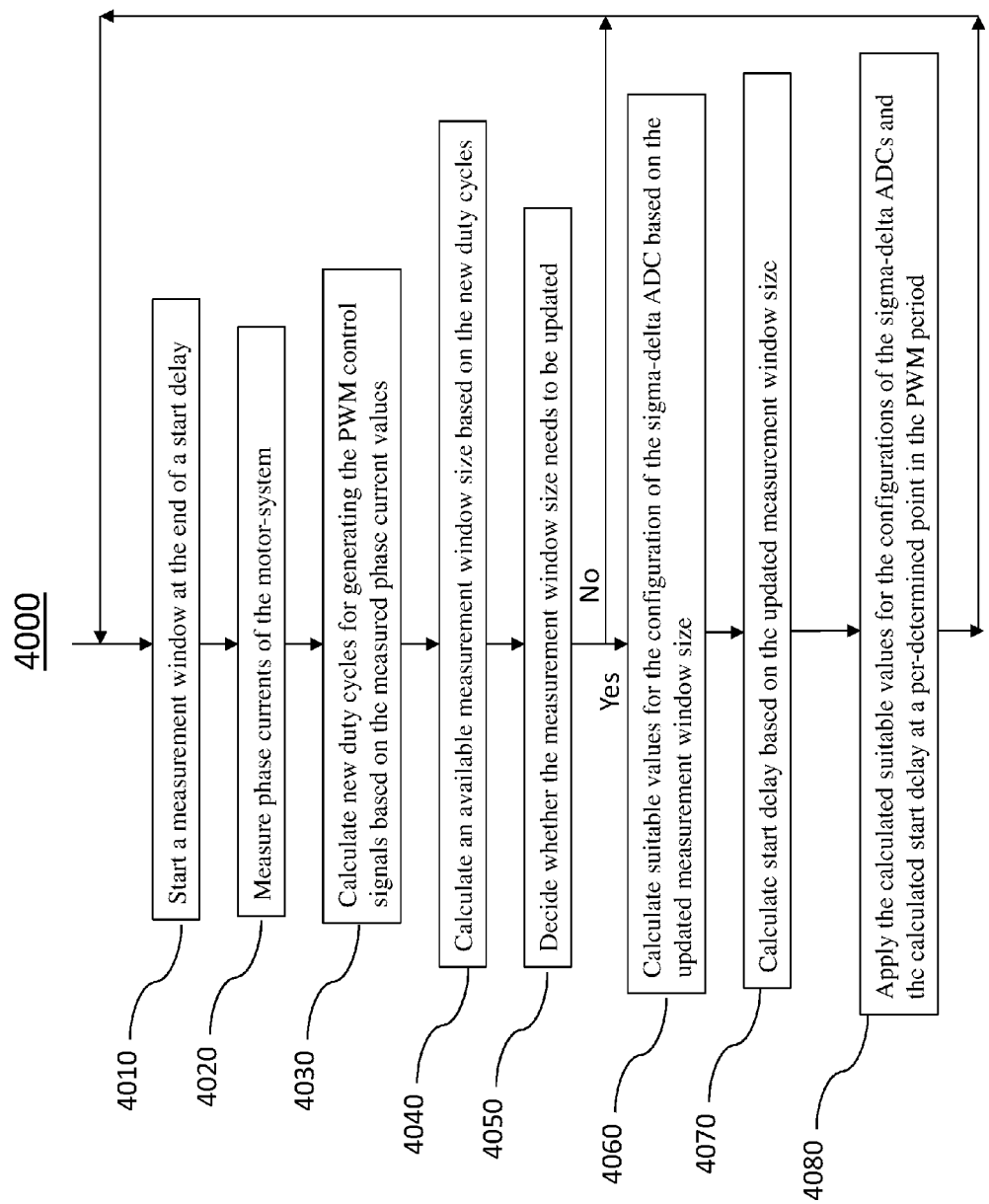
FIG. 12 illustrates a flow diagram for a method of operating a sigma-delta ADC.

FIGS. 11 and 12 each illustrates a flow chart of a method of operating a sigma-delta analog-to-digital converter (ADC), in accordance with some embodiments. It should be understood that the embodiment methods shown in FIGS. 11 and 12 are examples of many possible embodiment methods. One of ordinary skill in the art would recognize many variations, alternatives, and modifications. For example, various steps as illustrated in FIG. 11 or 12 may be added, removed, replaced, rearranged and repeated.

Referring to FIG. 11, at step 3010, an analog input signal is converted into a sequence of digital data using a sigma-delta modulator of a sigma-delta ADC. At step 3020, a first configuration for a decimation filter of the sigma-delta ADC is set according to a first condition of a measurement window. At step 3030, the sequence of digital data is filtered using a low-pass filter (LPF) of the decimation filter. At step 3040, in response to a change in the measurement window, a second configuration for the decimation filter is set according to a second condition of the measurement window.

FIG. 12 illustrates an embodiment method of operating a sigma-delta ADC. In particular, methods for iteratively setting or updating the configuration of the sigma-delta ADCs and the configuration for measurement of a motor-system is described herein. At step 4010, a measurement window (e.g., $MW_1$ in FIG. 9) is started at the end of a start delay (e.g., $SD_1$ in FIG. 9). Configuration of the sigma-delta ADC (e.g., order K for LPF 423, decimation factor D for decimator 425, gain F and offset OFFS for the gain adjustment module 430) and configuration for measurement of the motor system (e.g., start delay $SD_1$) may use a pre-determined initial setting, or use a setting from the last iteration as the current configuration. At step 4020, phase currents of the motor-system are measured, e.g., by one or more sigma-delta ADCs using the current configuration of the sigma-delta ADCs and the current configuration for the measurement of the motor system. At step 4030, new duty cycles for generating the PWM control signals are calculated based on the measured phase current values. At step 4040, an available measurement window size is calculated based on the new duty cycles. For example, FIGS. 2, 3A and 3B illustrate the relation between duty cycles and available measurement window size.

At step 4050, a decision regarding whether the measurement window size needs to be updated is made. For example, if the available measurement window size is smaller than the current measurement window size, then the measurement window size needs to be updated (e.g., reduced) to fit within the available measurement window size. Conversely, when available measurement window size is larger than the current measurement window size, the measurement window size may be updated (e.g., increased) to provide more bit resolution for the output of the sigma-delta ADCs. A another example, the measurement window size may remain the same, e.g., when available measurement window size remain substantially the same, or when more bit resolution is not needed even with a larger available measurement window size. If the decision regarding whether the measurement window size needs to be updated is yes, then continue with step 4060; otherwise, go to step 4010. At step 4060, suitable values for the configuration of the sigma-delta ADCs (e.g., order K for LPF 423, decimation factor D for decimator 425, gain F and offset OFFS for the gain adjustment module 430) are calculated based on the updated measurement window size.

At step 4070, suitable values for the configuration (e.g., start delay $SD_1$) for the measurement of motor system is calculated based on the updated measurement window size. At step 4080, the calculated values (e.g., order K for LPF 423, decimation factor D for decimator 425, gain F and offset OFFS for the gain adjustment module 430, and start delay $SD_1$) are applied to update the configurations of the sigma-delta ADCs and the configuration for measurement of the motor system at a per-determined time in the PWM period, e.g., at the end of the current measurement window, or when PWM timer counters to zero. In cases where the measurement window size remains the same, the configuration of the sigma-delta ADCs and the configuration for measurement of the motor system may remain the same. After step 4080, the method goes back to step 4010 for the next iteration.

One general aspect of the present disclosure includes a method of operating a sigma-delta analog-to-digital converter (ADC) including converting an analog input signal into a sequence of digital data using a sigma-delta modulator of the sigma-delta ADC, setting a first configuration for a decimation filter of the sigma-delta ADC according to a first condition of a measurement window, filtering the sequence of digital data using a low-pass filter (LPF) of the decimation filter, and in response to a change in the measurement window, setting a second configuration for the decimation filter according to a second condition of the measurement window.

Implementations may include one or more of the following features. In some embodiments, the analog input signal has a first signal level during a first time interval that is larger than a second signal level during a second time interval, the method further includes converting the first signal level into a first digital value and the second signal level into a second digital value, and the first digital value has a first bit resolution that is smaller than a second bit resolution of the second digital value. The method further includes scaling an output of the decimation filter with a scale factor, where setting the second configuration includes adjusting the scale factor, and a gain of the sigma-delta ADC remains substantially the same between the first configuration and the second configuration, in accordance with some embodiments. In an embodiment, the first condition of the measurement window includes a first duration of the measurement window and a signal level of the analog input signal. In another embodiment, the first condition of the measurement window includes a first duration of the measurement window and a first location of the measurement window within a measurement cycle. The first condition of the measurement window may further include a signal level of the analog input signal. The sequence of digital data may include digital samples obtained at a first sampling frequency, and the setting the first configuration includes setting an order (R) of the LPF and a decimation rate (D) of the decimation filter, where a time interval occupied by R×D digital samples is less than the first duration of the measurement window. The filtering may include filtering a portion of the sequence of digital data that arrives after a pre-determined settling time from the start of the measurement window. The setting the first configuration may include choosing a combination of R and D such that a first pre-determined bit resolution is achieved at an output of the LPF.

In some embodiments, the filtering produces a measured phase current value, where the change of the measurement window is determined by a process including calculating duty cycle values based on the measured phase current value, calculating an updated measurement window size based on the duty cycles, and comparing the updated measurement window size with the first duration of the measurement window. In other embodiments, the setting the second configuration includes modifying R and D according to a second duration of the measurement window under the second condition such that the time interval is less than the second duration, and a second pre-determined bit resolution is achieved at the output of the LPF. The modifying R and D may be performed at a per-determined time in a measurement cycle. The method may further include scaling an output of the decimation filter by a scale factor, thereby producing a scaled output, and adjusting the scale factor with the setting the second configuration such that a gain of the sigma-delta ADC remains substantially the same with the first configuration and the second configuration. The method may further include adding an offset value to the scaled output. The method may further include adjusting the offset value according to a numerical range of the scaled output.

Another general aspect of the present disclosure includes a sigma-delta analog-to-digital converter (ADC) including a sigma-delta modulator configured to convert an analog input signal into a sequence of digital data, and a decimation filter including a low-pass filter (LPF) with a filter order (R), where the LPF is configured to filter the sequence of digital data; and a down-sampler having a decimation factor (D), where the down-sampler is configured to down-sample an output of the LPF, where at least one of the filter order (R) and the decimation factor (D) is adjustable, where at least one of the filer order (R) and the decimation rate (D) is configured to be adjusted in response to a change in a measurement window.

Implementations may include one or more of the following features. The sigma-delta modulator is configured to be in a power saving mode outside the measurement window, in an embodiment. The sigma-delta ADC further includes a controller coupled to the sigma-delta ADC, where the controller is configured to adjust at least one of R and D in response to the change in the measurement window, such that a time interval occupied by R×D samples of the sequence of digital data is less than a duration of the measurement window while achieving a pre-determined bit precision for an output of the sigma-delta ADC, in various embodiments. The sigma-delta ADC may further include a scaling unit with a scaling factor that is adjustable, where the scaling unit is configured to scale an output of the decimation filter by the scaling factor, where the scaling factor is configured to be adjusted with at least one of R and D such that a total gain of the sigma-delta ADC remains substantially the same before and after the change in the measurement window.

Another general aspect of the present disclosure includes a method of operating ac motors including receiving a first analog signal from a first phase of an AC motor, and a second analog signal from a second phase of the AC motor, converting the first received analog signal into a first digital value, and the second received analog signal into a second digital value using a first sigma-delta analog-to-digital converter (ADC) and a second sigma-delta ADC, respectively, setting a configuration of a sigma-delta decimation filter of each of the first sigma-delta ADC and the second sigma-delta ADC in accordance with a measurement window, and adaptively adjusting the configuration of the sigma-delta decimation filter in response to a change in the measurement window.

Implementations may include one or more of the following features. The converting includes converting the first received analog signal and the second received analog signal in parallel, for example. The converting further includes converting each of the first received analog signal and the second received analog signal into a digital output using a sigma-delta modulator of a corresponding one of the first sigma-delta ADC and the second sigma-delta ADC, and filtering the digital output using a low-pass filter (LPF) of a corresponding sigma-delta decimation filter, in some embodiments. The adaptively adjusting may include modifying at least one of an order (R) of the LPF and an over-sampling rate (OSR) of the first sigma-delta ADC and the second sigma-delta ADC. The sigma-delta modulator of each of the first sigma-delta ADC and the second sigma-delta ADC may have a sampling rate ($f_s$), where a time interval determined by $R \times OSR/f_s$ fits within a duration of the measurement window. The change of the measurement window may include a change in the duration of the measurement window, where the adaptively adjusting includes adjusting a combination of R and OSR such that a pre-determined bit precision is achieved for the first digital value and the second digital value, and such that the time internal fits within the duration of the measurement window after the change in the measurement window.

In accordance with an embodiment, the change of the measurement window includes a change of a location of the measurement window within a measurement cycle, where the adaptively adjusting further includes adjusting a location of the time interval within the duration of the measurement window. In an embodiment, the measurement window corresponds to a period during which electrical currents flow through a first shunt resistor in a first half bridge of the AC motor, and a second shunt resistor in a second half bridge of the AC motor. In other embodiments, at least one of a location and a duration of the measurement window changes under different torque conditions of the AC motor. The duration of the measurement window may increase when the torque of the AC motor decreases, and the duration of the measurement window may decrease when the torque of AC motor increases.

In some embodiment, the adaptively adjusting further includes adjusting a scale factor of the first sigma-delta ADC and a scale factor of the second sigma-delta ADC according to the configuration of the sigma-delta decimation filter such that a total gain of the first sigma-delta ADC and a total gain of the second sigma-delta ADC remain substantially the same before and after the change in the measurement window. In an embodiment, the method further includes controlling electrical currents in a first half bridge of the AC motor and a second half bridge of the AC motor based on the first digital value and the second digital value. The method further includes receiving a third analog signal from a third phase of the AC motor, converting the third received analog signal into a third digital value using a third sigma-delta ADC, setting a configuration of a sigma-delta decimation filter of the third sigma-delta ADC in accordance with the measurement window, and adaptively adjusting the configuration of the sigma-delta decimation filter of the third sigma-delta ADC in response to a change in the measurement window, in various embodiments.

According to another aspect of the present disclosure, a circuit includes a first sigma-delta demodulator configured to accept as input a first sequence of digital samples from a first sigma-delta modulator coupled to a first phase of an AC motor, a second sigma-delta demodulator configured to accept as input a second sequence of digital samples from a second sigma-delta modulator coupled to a second phase of the AC motor, where each of the first sigma-delta demodulator and the second sigma-delta demodulator has a same input data rate and includes a low-pass filter (LPF) and a down-sampler, where an order (R) of the LPF and a decimation rate (D) of the down-sampler are reconfigurable, and a control module configured to adjust the order of the LPF and the decimation rate of the down-sampler according to different operating conditions of the AC motor.

Implementations may include one or more of the following features. The duration of a measurement window of the AC motor changes according to the different operating conditions of the AC motor, where the control module is configured to adjust R and D such that a time interval corresponding to $R \times D$ digital samples is less than the duration of the measurement window under the different operating conditions of the AC motor, in some embodiments. The circuit may further include a scaling unit for each of the first sigma-delta demodulator and the second sigma-delta demodulator, where a scaling factor of the scaling unit is reconfigurable. The control module may be configured to modify the scaling factor such that a total gain of each of the first sigma-delta demodulator and the second sigma-delta demodulator remains substantially the same under the different operating conditions of the AC motor. The duration of the measurement windows may decrease when a torque of the AC motor increases, and the duration of the measurement windows may increase when a torque of the AC motor decreases.

In accordance with some embodiments, the circuit further includes the first sigma-delta modulator and the second sigma-delta modulator. The circuit may further include the ac motor. The first sigma-delta modulator and the first sigma-delta demodulator may be integrated into a semiconductor device. The second sigma-delta modulator and the second sigma-delta demodulator may also be integrated into the semiconductor device. In an embodiment, the circuit further includes a third sigma-delta demodulator configured to accept as input a third sequence of digital samples from a third sigma-delta modulator coupled to a third phase of the AC motor, where the third sigma-delta demodulator has a same input data rate as the first sigma-delta demodulator, and includes a third low-pass filter (LPF) and a third down-sampler, where an order of the third LPF and a decimation rate of the third down-sampler are reconfigurable, and where the control module is configured to adjust the order of the third LPF and the decimation rate of the third down-sampler according to different operating conditions of the AC motor.

Advantages of embodiments of the present invention include improved signal acquisition quality. By adaptively adjusting the configurations of the sigma-delta ADC in response to different operating conditions, the tradeoff between the span of decimation filter and the bit resolution of ADC output can be optimized. In motor control applications, by adaptively adjusting the configurations of the ADC, high bit resolutions ADC output are obtained for precise motor control under low-torque operating conditions, and a small span of LPF filter is achieved to accommodate small measurement windows under high-torque operating conditions. Since sigma-delta ADCs can receive analog signals with very low signal amplitude (e.g., about 100 mV) as input, sigma-delta ADCs can be coupled directly to shunt resistors without the need for an amplifier to amplify the shunt voltages. This saves the cost associated with the amplifier, which could be high considering bandwidth, noise and common-mode rejection requirements for the amplifier. In addition, since the amplifier needs a settling time which reduces the measurement window size, the presently disclosed methods can provide a larger measurement window size by not using an amplifier. Another advantage of the embodiment methods includes a substantially constant gain for the sigma-delta ADC, which is obtained by adaptively adjusting a scaling factor of the gain adjustment module of the sigma-delta ADC with the adjustment of the configurations of the decimation filter. A substantially constant gain factor of the ADC makes it easier for other modules to use the measured values from the ADC without the need to know the internal configurations of the ADC. For example, a control loop can monitor the ADC output values and make control decisions, without having to compensate for the different gain factors caused by different configurations of the decimation filter of the ADC.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A method of operating a sigma-delta analog-to-digital converter (ADC) comprising:
   converting an analog input signal into a sequence of digital data using a sigma-delta modulator of the sigma-delta ADC;
   setting a first configuration for a decimation filter of the sigma-delta ADC according to a first condition of a measurement window, wherein the first condition of the measurement window comprises a first duration of the measurement window;
   filtering the sequence of digital data using a low-pass filter (LPF) of the decimation filter; and
   in response to a change in the measurement window, setting a second configuration for the decimation filter according to a second condition of the measurement window.

2. The method of claim 1, wherein:
   the analog input signal has a first signal level during a first time interval that is larger than a second signal level during a second time interval;
   the method further comprises converting the first signal level into a first digital value and the second signal level into a second digital value; and
   the first digital value has a first bit resolution that is smaller than a second bit resolution of the second digital value.

3. The method of claim 2, further comprising scaling an output of the decimation filter with a scale factor, wherein setting the second configuration comprises adjusting the scale factor, and a gain of the sigma-delta ADC remains substantially the same between the first configuration and the second configuration.

4. The method of claim 1, wherein the first condition of the measurement window further comprises a first location of the measurement window within a measurement cycle.

5. The method of claim 1, wherein the first condition of the measurement window further comprises a signal level of the analog input signal.

6. The method of claim 5, wherein the sequence of digital data comprise digital samples obtained at a first sampling frequency, and the setting the first configuration comprises setting an order (R) of the LPF and a decimation rate (D) of the decimation filter, wherein a time interval occupied by R×D digital samples is less than the first duration of the measurement window.

7. The method of claim 6, wherein the filtering comprises filtering a portion of the sequence of digital data that arrives after a pre-determined settling time from the start of the measurement window.

8. The method of claim 6, wherein the setting the first configuration comprises choosing a combination of R and D such that a first pre-determined bit resolution is achieved at an output of the LPF.

9. The method of claim 6, wherein the filtering produces a measured phase current value, wherein the change of the measurement window is determined by a process comprising:
   calculating duty cycle values based on the measured phase current value;
   calculating an updated measurement window size based on the duty cycles; and
   comparing the updated measurement window size with the first duration of the measurement window.

10. The method of claim 8, wherein the setting the second configuration comprises modifying R and D according to a second duration of the measurement window under the second condition such that the time interval is less than the second duration, and a second pre-determined bit resolution is achieved at the output of the LPF.

11. The method of claim 10, wherein the modifying R and D are performed at a pre-determined time in a measurement cycle.

12. The method of claim 10, further comprising:
   scaling an output of the decimation filter by a scale factor, thereby producing a scaled output; and
   adjusting the scale factor with the setting the second configuration such that a gain of the sigma-delta ADC remains substantially the same with the first configuration and the second configuration.

13. The method of claim 12, further comprising adding an offset value to the scaled output.

14. The method of claim 13, further comprising adjusting the offset value according to a numerical range of the scaled output.

15. A sigma-delta analog-to-digital converter (ADC) comprising:
   a sigma-delta modulator configured to convert an analog input signal into a sequence of digital data; and
   a decimation filter comprising:
      a low-pass filter (LPF) with a filter order (R), wherein the LPF is configured to filter the sequence of digital data; and
      a down-sampler having a decimation factor (D), wherein the down-sampler is configured to down-sample an output of the LPF, wherein at least one of the filter order (R) and the decimation factor (D) is adjustable, wherein at least one of the filter order (R)

and the decimation rate (D) is configured to be adjusted in response to a change in a measurement window.

16. The sigma-delta ADC of claim 15, wherein the sigma-delta modulator is configured to be in a power saving mode outside the measurement window.

17. The sigma-delta ADC of claim 15, further comprising a controller coupled to the sigma-delta ADC, wherein the controller is configured to adjust at least one of R and D in response to the change in the measurement window, such that a time interval occupied by R×D samples of the sequence of digital data is less than a duration of the measurement window while achieving a pre-determined bit precision for an output of the sigma-delta ADC.

18. The sigma-delta ADC of claim 17, further comprising:
a scaling unit with a scaling factor that is adjustable, wherein the scaling unit is configured to scale an output of the decimation filter by the scaling factor, wherein the scaling factor is configured to be adjusted with at least one of R and D such that a total gain of the sigma-delta ADC remains substantially the same before and after the change in the measurement window.

19. A method of operating AC motors comprising:
receiving a first analog signal from a first phase of an AC motor, and a second analog signal from a second phase of the AC motor;
converting the first received analog signal into a first digital value, and the second received analog signal into a second digital value using a first sigma-delta analog-to-digital converter (ADC) and a second sigma-delta ADC, respectively;
setting a configuration of a sigma-delta decimation filter of each of the first sigma-delta ADC and the second sigma-delta ADC in accordance with a measurement window; and
adaptively adjusting the configuration of the sigma-delta decimation filter in response to a change in the measurement window.

20. The method of claim 19, wherein the converting comprises converting the first received analog signal and the second received analog signal in parallel.

21. The method of claim 19, wherein the converting further comprises:
converting each of the first received analog signal and the second received analog signal into a digital output using a sigma-delta modulator of a corresponding one of the first sigma-delta ADC and the second sigma-delta ADC; and
filtering the digital output using a low-pass filter (LPF) of a corresponding sigma-delta decimation filter.

22. The method of claim 21, wherein the adaptively adjusting comprises modifying at least one of an order (R) of the LPF and an over-sampling rate (OSR) of the first sigma-delta ADC and the second sigma-delta ADC.

23. The method of claim 22, wherein the sigma-delta modulator of each of the first sigma-delta ADC and the second sigma-delta ADC has a sampling rate ($f_s$), wherein a time interval determined by R×OSR/$f_s$ fits within a duration of the measurement window.

24. The method of claim 23, wherein the change of the measurement window comprises a change in the duration of the measurement window, wherein the adaptively adjusting comprises adjusting a combination of R and OSR such that a pre-determined bit precision is achieved for the first digital value and the second digital value, and such that the time internal fits within the duration of the measurement window after the change in the measurement window.

25. The method of claim 23, wherein the change of the measurement window comprises a change of a location of the measurement window within a measurement cycle, wherein the adaptively adjusting further comprises adjusting a location of the time interval within the duration of the measurement window.

26. The method of claim 19, wherein the measurement window corresponds to a period during which electrical currents flow through a first shunt resistor in a first half bridge of the AC motor, and a second shunt resistor in a second half bridge of the AC motor.

27. The method of claim 19, wherein at least one of a location and a duration of the measurement window changes under different torque conditions of the AC motor.

28. The method of claim 27, wherein the duration of the measurement window increases when the torque of the AC motor decreases, wherein the duration of the measurement window decreases when the torque of AC motor increases.

29. The method of claim 19, wherein the adaptively adjusting further comprises:
adjusting a scale factor of the first sigma-delta ADC and a scale factor of the second sigma-delta ADC according to the configuration of the sigma-delta decimation filter such that a total gain of the first sigma-delta ADC and a total gain of the second sigma-delta ADC remain substantially the same before and after the change in the measurement window.

30. The method of claim 29, further comprising:
controlling electrical currents in a first half bridge of the AC motor and a second half bridge of the AC motor based on the first digital value and the second digital value.

31. The method of claim 19, further comprising:
receiving a third analog signal from a third phase of the AC motor;
converting the third received analog signal into a third digital value using a third sigma-delta ADC;
setting a configuration of a sigma-delta decimation filter of the third sigma-delta ADC in accordance with the measurement window; and
adaptively adjusting the configuration of the sigma-delta decimation filter of the third sigma-delta ADC in response to a change in the measurement window.

32. A circuit comprising:
a first sigma-delta demodulator configured to accept as input a first sequence of digital samples from a first sigma-delta modulator coupled to a first phase of an AC motor;
a second sigma-delta demodulator configured to accept as input a second sequence of digital samples from a second sigma-delta modulator coupled to a second phase of the AC motor;
wherein each of the first sigma-delta demodulator and the second sigma-delta demodulator has a same input data rate and comprises a low-pass filter (LPF) and a down-sampler, wherein an order (R) of the LPF and a decimation rate (D) of the down-sampler are reconfigurable; and
a control module configured to adjust the order of the LPF and the decimation rate of the down-sampler according to different operating conditions of the AC motor.

33. The circuit of claim 32, wherein a duration of a measurement window of the AC motor changes according to the different operating conditions of the AC motor, wherein the control module is configured to adjust R and D such that a time interval corresponding to R×D digital samples is less than the duration of the measurement window under the different operating conditions of the AC motor.

34. The circuit of claim 33, further comprising a scaling unit for each of the first sigma-delta demodulator and the second sigma-delta demodulator, wherein a scaling factor of the scaling unit is reconfigurable.

35. The circuit of claim 34, wherein the control module is configured to modify the scaling factor such that a total gain of each of the first sigma-delta demodulator and the second sigma-delta demodulator remains substantially the same under the different operating conditions of the AC motor.

36. The circuit of claim 35, wherein the duration of the measurement windows decreases when a torque of the AC motor increases, and the duration of the measurement windows increases when a torque of the AC motor decreases.

37. The circuit of claim 32, further comprising the first sigma-delta modulator and the second sigma-delta modulator.

38. The circuit of claim 37, further comprising the AC motor.

39. The circuit of claim 37, wherein the first sigma-delta modulator and the first sigma-delta demodulator are integrated into a semiconductor device.

40. The circuit of claim 39, wherein the second sigma-delta modulator and the second sigma-delta demodulator are integrated into the semiconductor device.

41. The circuit of claim 32, further comprising a third sigma-delta demodulator configured to accept as input a third sequence of digital samples from a third sigma-delta modulator coupled to a third phase of the AC motor, wherein the third sigma-delta demodulator has a same input data rate as the first sigma-delta demodulator, and comprises a third low-pass filter (LPF) and a third down-sampler, wherein an order of the third LPF and a decimation rate of the third down-sampler are reconfigurable, and wherein the control module is configured to adjust the order of the third LPF and the decimation rate of the third down-sampler according to different operating conditions of the AC motor.

42. The circuit of claim 32, wherein each of the different operating conditions of the AC motor comprises a duration of a measurement window of the AC motor.

* * * * *